(12) United States Patent
Lee et al.

(10) Patent No.: US 12,277,902 B2
(45) Date of Patent: Apr. 15, 2025

(54) DISPLAY DEVICE

(71) Applicant: Samsung Display Co., LTD., Yongin-si (KR)

(72) Inventors: Seung Jun Lee, Asan-si (KR); Yong Su Lee, Seoul (KR); Jae Woo Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/886,995

(22) Filed: Aug. 12, 2022

(65) Prior Publication Data

US 2023/0131089 A1   Apr. 27, 2023

(30) Foreign Application Priority Data

Oct. 25, 2021   (KR) .......................... 10-2021-0142569

(51) Int. Cl.
*G09G 3/3233* (2016.01)
*H10K 59/121* (2023.01)

(52) U.S. Cl.
CPC ........ *G09G 3/3233* (2013.01); *H10K 59/1216* (2023.02); *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0233* (2013.01);
(Continued)

(58) Field of Classification Search
CPC ..... H01L 27/124; H01L 28/60; H10K 59/131; H10K 59/1216; H10K 59/1213; H10K 59/1201; G09G 3/3225; G09G 2300/043; G09G 2300/0852; G09G 2310/0216; G09G 2310/0251
See application file for complete search history.

(56) References Cited

U.S. PATENT DOCUMENTS

| 12,069,924 B2 * | 8/2024 | Wang .................. G09G 3/3266 |
| 2007/0035487 A1 * | 2/2007 | Ryu ..................... G09G 3/3233 345/76 |

(Continued)

FOREIGN PATENT DOCUMENTS

| KR | 1999-0065798 | 8/1999 |
| KR | 10-2021-0018673 | 2/2021 |
| KR | 10-2258240 | 5/2021 |

*Primary Examiner* — Shaheda A Abdin
(74) *Attorney, Agent, or Firm* — KILE PARK REED & HOUTTEMAN PLLC

(57) ABSTRACT

A display device is provided. A display device comprises a light emitting element disposed on a substrate, a driving transistor that provides a driving current to the light emitting element according to a voltage of a gate electrode, a first transistor supplying a data voltage to the gate electrode of the driving transistor, a first capacitor comprising a first capacitor electrode electrically connected to a first driving voltage line to which a first driving voltage is applied and a common capacitor electrode electrically connected to a first electrode of the first transistor, and a second capacitor comprising a second capacitor electrode electrically connected to the gate electrode of the driving transistor and the common capacitor electrode of the first capacitor, wherein the first capacitor electrode, the common capacitor electrode, and the second capacitor electrode overlap each other in a thickness direction of the substrate.

20 Claims, 25 Drawing Sheets

105: G1, G6, CE2
110: CEC
115: CE1
120: VDDL, BE, ANDE
EML: 170, 180

(52) U.S. Cl.
    CPC ............ *G09G 2320/0247* (2013.01); *G09G 2330/021* (2013.01)

(56) References Cited

U.S. PATENT DOCUMENTS

| | | | |
|---|---|---|---|
| 2012/0223875 A1* | 9/2012 | Lau | G09G 3/32 345/82 |
| 2014/0098078 A1* | 4/2014 | Jeon | H10K 59/1216 345/82 |
| 2014/0299843 A1* | 10/2014 | Kim | H01L 27/1255 438/23 |
| 2015/0108437 A1* | 4/2015 | Cho | G09G 3/3233 257/40 |
| 2018/0175077 A1* | 6/2018 | Koo | H10K 59/126 |
| 2019/0393291 A1* | 12/2019 | Jeon | H10K 59/131 |
| 2020/0302869 A1* | 9/2020 | Park | G09G 3/3258 |

\* cited by examiner

DISPLAY DEVICE

CROSS-REFERENCE TO RELATED APPLICATION(S)

This application claims priority to and benefits of Korean Patent Application No. 10-2021-0142569 under 35 U.S.C. § 119, filed on Oct. 25, 2021, in the Korean Intellectual Property Office, the entire contents of which are incorporated herein by reference.

BACKGROUND

1. Technical Field

The disclosure relates to a display device.

2. Description of the Related Art

With the advance of information-oriented society, more and more demands are placed on display devices for displaying images in various ways. The display device may be a flat panel display device such as a liquid crystal display, a field emission display and a light emitting display. A light emitting display device may include an organic light emitting display device including an organic light emitting diode element as a light emitting element, an inorganic light emitting display device including an inorganic semiconductor element as a light emitting element, or a micro light emitting element.

The display device may include pixels, and each of pixels may include a light emitting element, a driving transistor for controlling the amount of the driving current supplied to the light emitting element based on the voltage of a gate electrode, and a scan transistor for supplying the data voltage of a data line to the gate electrode of the driving transistor in response to the scan signal of a scan line.

Each of the pixels may include transistors and capacitors to allow the light emitting element to emit light. The area occupied by transistors in each of the pixels may be large, leaving insufficient space for the capacitors. Since multiple transistors are required for a light emitting element to emit light, there is a limit to how much area may be reduced in each of the pixels.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of solving the lack of space for forming multiple capacitors.

However, aspects of the disclosure are not restricted to the one set forth herein. The above and other aspects of the disclosure will become more apparent to one of ordinary skill in the art to which the disclosure pertains by referencing the detailed description of the disclosure given below.

According to the embodiments of the disclosure, a display device may comprise a light emitting element disposed on a substrate, a driving transistor providing a driving current to the light emitting element according to a voltage of a gate electrode, a first transistor supplying a data voltage to the gate electrode of the driving transistor, a first capacitor comprising a first capacitor electrode electrically connected to a first driving voltage line to which a first driving voltage is applied and a common capacitor electrode connected to a first electrode of the first transistor, and a second capacitor comprising a second capacitor electrode connected to the gate electrode of the driving transistor and the common capacitor electrode of the first capacitor. The first capacitor electrode, the common capacitor electrode, and the second capacitor electrode may overlap each other in a thickness direction of the substrate.

A size of an overlapping area of the first capacitor electrode and the common capacitor electrode and a size of an overlapping area of the second capacitor electrode and the common capacitor electrode may be substantially equal to each other.

The display device may further comprise a reference voltage line applying a reference voltage to a first node, and an initialization voltage line applying an initialization voltage to a second node. The common capacitor electrode may be electrically connected to the first node. The second capacitor electrode may be electrically connected to the second node.

The gate electrode of the driving transistor may overlap the common capacitor electrode in the thickness direction of the substrate.

The first capacitor electrode may comprise a non-overlapping area that does not overlap the second capacitor electrode in the thickness direction of the substrate. The non-overlapping area may overlap the common capacitor electrode in the thickness direction of the substrate.

The first capacitor electrode may comprise a first edge extending in a first direction and a second edge extending in a second direction. The second capacitor electrode may comprise a third edge extending in the first direction and a fourth edge extending in the second direction. The first edge may be shifted in the second direction compared to the third edge. The second edge may be shifted in the first direction compared to the fourth edge.

The first capacitor electrode may be disposed on a flat top surface of the second capacitor electrode.

The first capacitor electrode may not overlap an inclined side surface of the second capacitor electrode in the thickness direction of the substrate.

The common capacitor electrode may comprise a first opening penetrating the common capacitor electrode. The first capacitor electrode may comprise a second opening penetrating the first capacitor electrode. The first opening and the second opening may overlap each other in the thickness direction of the substrate.

An area of the second opening may be greater than an area of the first opening.

A width of the first opening in the first direction may be smaller than a width of the second opening in the first direction. A width of the first opening in the second direction may be smaller than a width of the second opening in the second direction.

A display device may further comprise a connection electrode electrically connected to the gate electrode of the driving transistor through a first contact hole in the first opening and the second opening.

An area of the common capacitor electrode may be greater than each of an area of the first capacitor electrode and an area of the second capacitor electrode.

A display device may further comprise a second contact hole that connects the common capacitor electrode to the first electrode of the first transistor.

The gate electrode of the driving transistor may comprise a main portion, a first protrusion protruding in a direction from a side of the main portion, and a second protrusion protruding in the direction from another side of the main portion.

The main portion may overlap, in the thickness direction of the substrate, an active layer comprising a semiconductor.

A display device may further comprise a connection electrode electrically connected to the first protrusion through a first contact hole that exposes the first protrusion.

Each of the first protrusion and the second protrusion may comprise a portion that does not overlap the first capacitor electrode and the common capacitor electrode in the thickness direction of the substrate.

According to another embodiment of the disclosure, a display device comprises an active layer disposed on a substrate, a gate insulating layer disposed on the active layer, a gate electrode and a first capacitor electrode disposed on the gate insulating layer, the gate electrode overlapping a part of the active layer in a thickness direction of the substrate, a first interlayer insulating layer disposed on the gate electrode and the first capacitor electrode, a common capacitor electrode disposed on the first interlayer insulating layer, the common capacitor overlapping the first capacitor electrode in the thickness direction of the substrate, a second interlayer insulating layer disposed on the common capacitor electrode, and a second capacitor electrode disposed on the second interlayer insulating layer, the second capacitor electrode overlapping the common capacitor electrode in the thickness direction of the substrate. The first capacitor electrode, the common capacitor electrode, and the second capacitor electrode overlap each other in the thickness direction of the substrate.

A size of an overlapping area of the first capacitor electrode and the common capacitor electrode and a size of an overlapping area of the second capacitor electrode and the common capacitor electrode may be substantially equal to each other.

In accordance with the display device according to embodiments, it is possible to provide the display device capable of solving the lack of space for multiple capacitors by stacking capacitor electrodes the pixels.

In accordance with the display device according to embodiments, it is possible to minimize an error in the overlapping area of the capacitor electrodes by disposing an upper capacitor electrode on a flat top surface.

In accordance with the display device according to embodiments, sufficient capacitance for each of the capacitors may be obtained by increasing the overlapping area of the capacitor electrodes.

However, the effects of the disclosure are not limited to these effects, and other effects may be included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
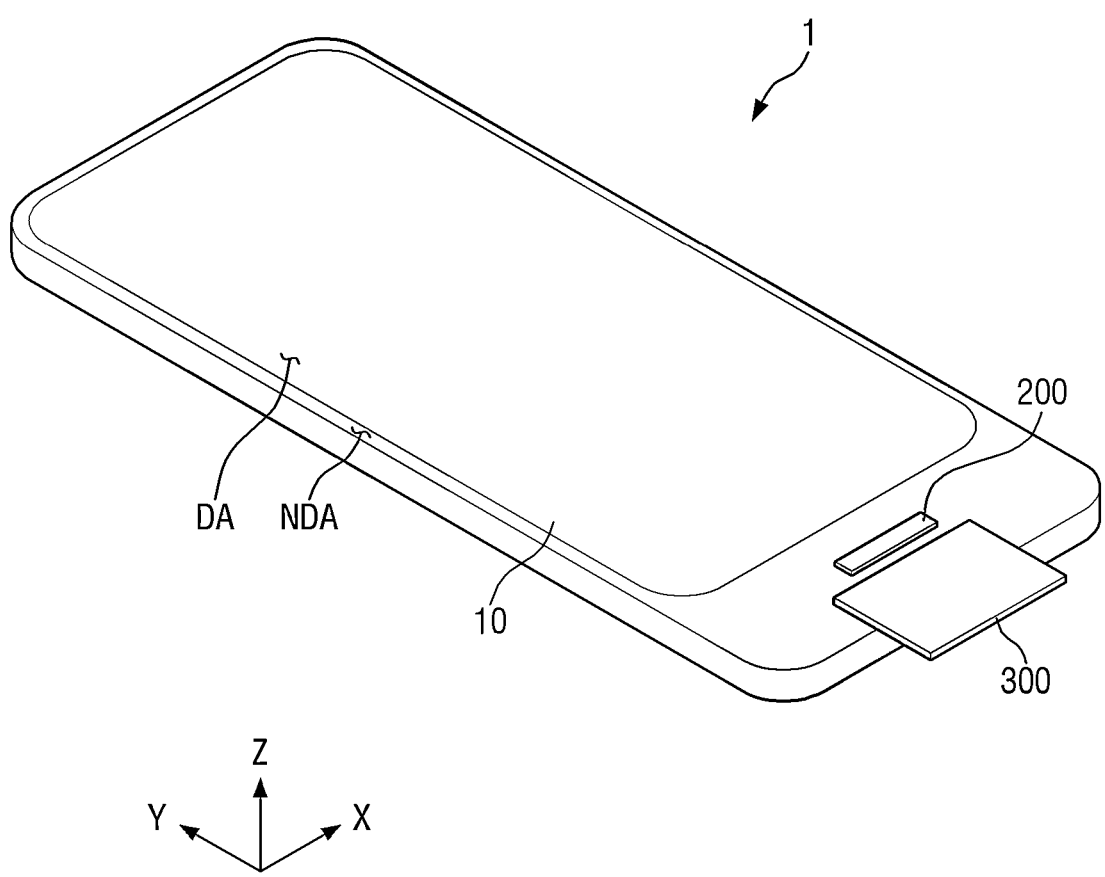
FIG. 1 is a schematic perspective view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, a phrase "an element A on an element B" refers to that the element A may be disposed directly on the element B and/or the element A may be disposed indirectly on the element B via another element C. Like reference numerals denote like elements throughout the descriptions. The figures, dimensions, ratios, angles, numbers of elements given in the drawings are merely illustrative and are not limiting.

Although terms such as first, second, etc. are used to distinguish arbitrarily between the elements such terms describe, and thus these terms are not necessarily intended to indicate temporal or other prioritization of such elements. These terms are used to merely distinguish one element from another. Accordingly, as used herein, a first element may be a second element within the technical scope of the disclosure.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings.

Figure 2:
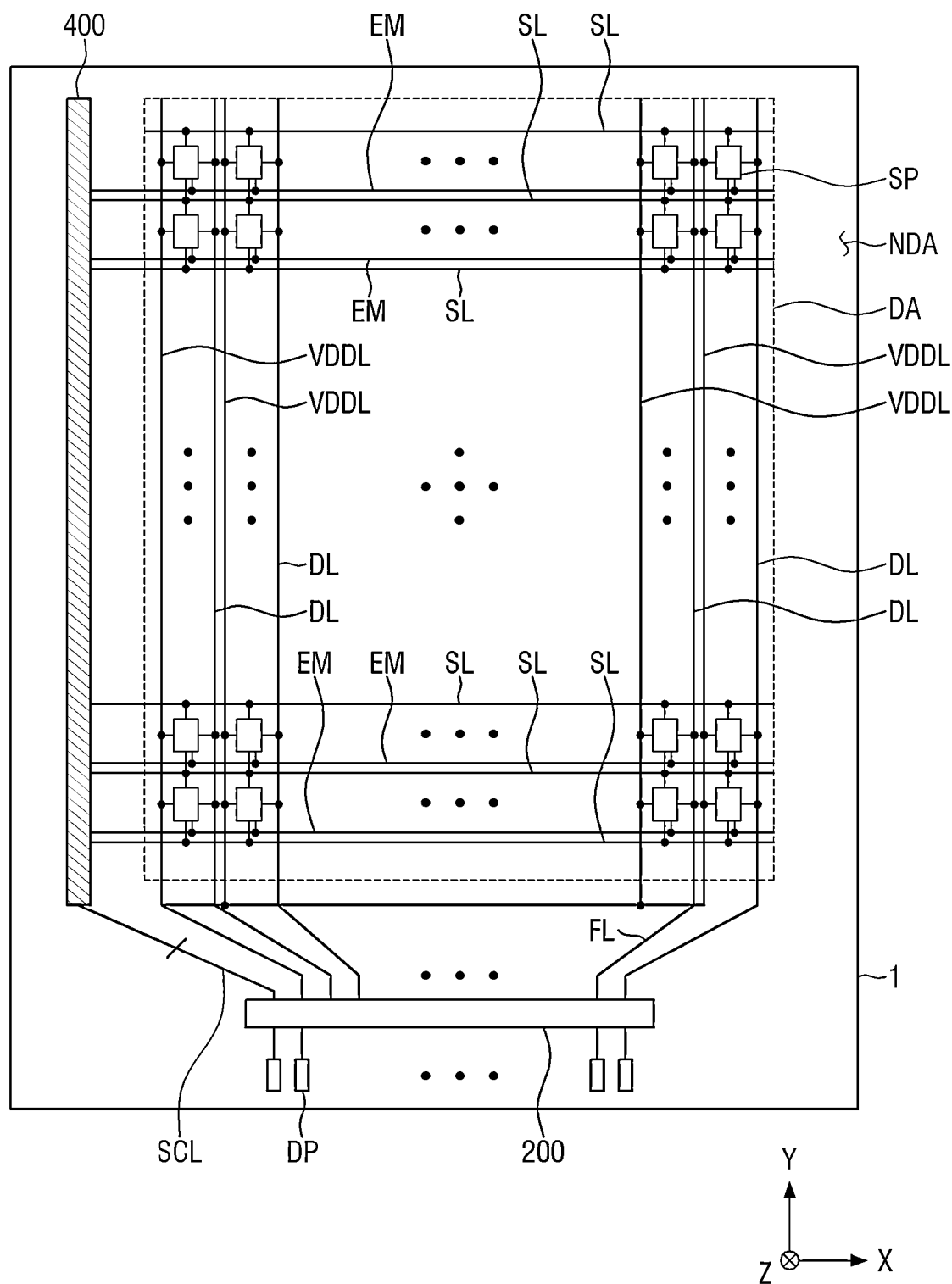
FIG. 2 is a schematic plan view illustrating a display device according to an embodiment.
Figure 3:
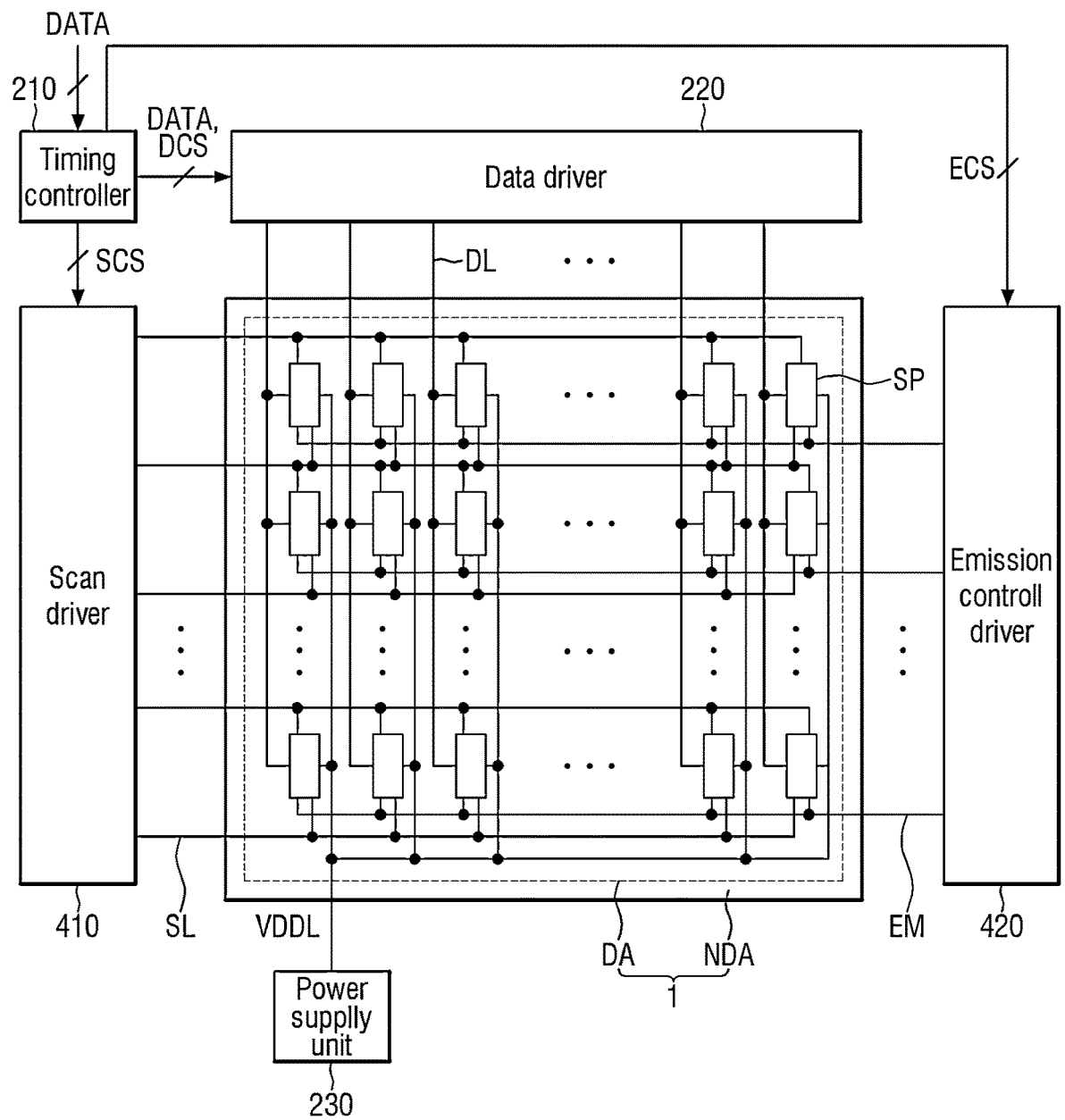
FIG. 3 is a block diagram illustrating a display device according to an embodiment.

FIG. 1 is a schematic perspective view illustrating a display device according to an embodiment. FIG. 2 is a schematic plan view illustrating a display device according to an embodiment. FIG. 3 is a block diagram illustrating a display device according to an embodiment.

The terms "above," "top" and "upper surface" used herein refer to an upward direction (i.e., a Z-axis direction) with respect to a display panel 10. The terms "below," "bottom" and "lower surface" used herein refer to a downward direction (i.e., a direction opposite to the Z-axis direction) with respect to the display panel 10. Further, "left", "right", "upper" and "lower" indicate directions when the display panel 10 is viewed from above. For example, the term "left" indicates a direction opposite to an X-axis direction, the term "right" indicates the X-axis direction, the term "upper" indicates a Y-axis direction, and the term "lower" indicates a direction opposite to the Y-axis direction.

Referring to FIGS. 1 to 3, the display device 1 may be a device for displaying a moving image or a still image. The display device 10 may be used as a display screen of various devices, such as a television, a laptop computer, a monitor, a billboard and an Internet-of-Things (JOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 1 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro light emitting diode (LED). In the following description, display device 1 describes an organic light emitting display device, but the disclosure is not limited thereto.

The display device 1 includes a display panel 10, a display driving circuit 200, and a circuit board 300.

The display panel 10 may have a rectangular shape in a plan view, having short sides in a first direction (X-axis direction) and long sides in a second direction (Y-axis direction) crossing the first direction (X-axis direction). The corner where the short side in the first direction (X-axis direction) and the long side in the second direction (Y-axis direction) meet may be rounded to have a curvature or may be right-angled. The planar shape of the display panel 10 is not limited to the rectangular shape, and may have other polygonal shapes, a circular shape or an elliptical shape. The display panel 10 may be flat. However, without being limited thereto, the display panel 10 may include a curved portion formed at left and right ends and having a curvature or have a varying curvature. The display panel 10 may be flexible so that it can be curved, bent, folded, or rolled.

The display panel 10 may include a display area DA where sub-pixels SP are disposed to display an image, and a non-display area NDA which is a peripheral area of the display area DA. Scan lines SL electrically connected to the sub-pixels PX, emission control lines EM, data lines DL, and first driving voltage lines VDDL may be arranged in the display area DA with the sub-pixels PX. The scan lines SL and the emission control lines EM may be parallel in the first direction (X-axis direction), and the data lines DL may be parallel in the second direction (Y-axis direction) intersecting the first direction (X-axis direction). The first driving voltage lines VDDL may be parallel along the second direction (Y-axis direction) in the display area DA. The first driving voltage lines VDDL formed in parallel along the second direction (Y-axis direction) in the display area DA may be electrically connected to each other in the non-display area NDA.

Each of the sub-pixels SP may be electrically connected to at least one of the scan lines SL, one of the data lines DL, at least one of the emission control lines EM, and the first driving voltage line VDDL. FIG. 2 illustrates each of the sub-pixels SP electrically connected to two scan lines SL, one data line DL, one emission control line EM, and the first driving voltage line VDDL, the disclosure is not limited thereto. For example, each of the sub-pixels SP may be electrically connected to four scan lines SL rather than two scan lines SL.

Each of the sub pixels SP may include a driving transistor DT, at least one transistor ST, a light emitting element, and a capacitor. The transistor ST may be turned on when a scan signal is applied from the scan line SL, and thus a data voltage of the data line DL may be applied to a gate electrode of the driving transistor. The driving transistor may emit light by supplying a driving current to the light emitting element according to the data voltage applied to the gate electrode. The driving transistor and at least one transistor may be a thin film transistor. The light emitting element may emit light according to the driving current of the driving transistor. The light emitting element may be an organic light emitting diode including a first electrode, an organic light emitting layer and a second electrode. The capacitor may serve to keep constant the data voltage applied to the gate electrode of the driving transistor.

The non-display area NDA may be defined as an area from the boundary of the display area DA to the edge of the display panel 10. In the non-display area NDA, a scan driving circuit 400 for applying scan signals to the scan lines SL, the fan-out lines FL between the data lines DL and the display driving circuit 200, and the pads DP electrically connected to the display driving circuit 200 may be disposed. The display driving circuit 200 and the pads DP may be disposed on one edge of the display panel 10. The pads DP may be disposed closer to one edge of the display panel 10 than the display driving circuit 200.

The scan driving circuit 400 may be electrically connected to the display driving circuit 200 through scan control lines SCL. The scan driving circuit 400 may receive a scan control signal SCS and an emission control signal ECS from the display driving circuit 200 through the scan control lines SCL.

The scan driving circuit 400 may include a scan driver 410 and an emission control driver 420 as shown in FIG. 3.

Figure 4:
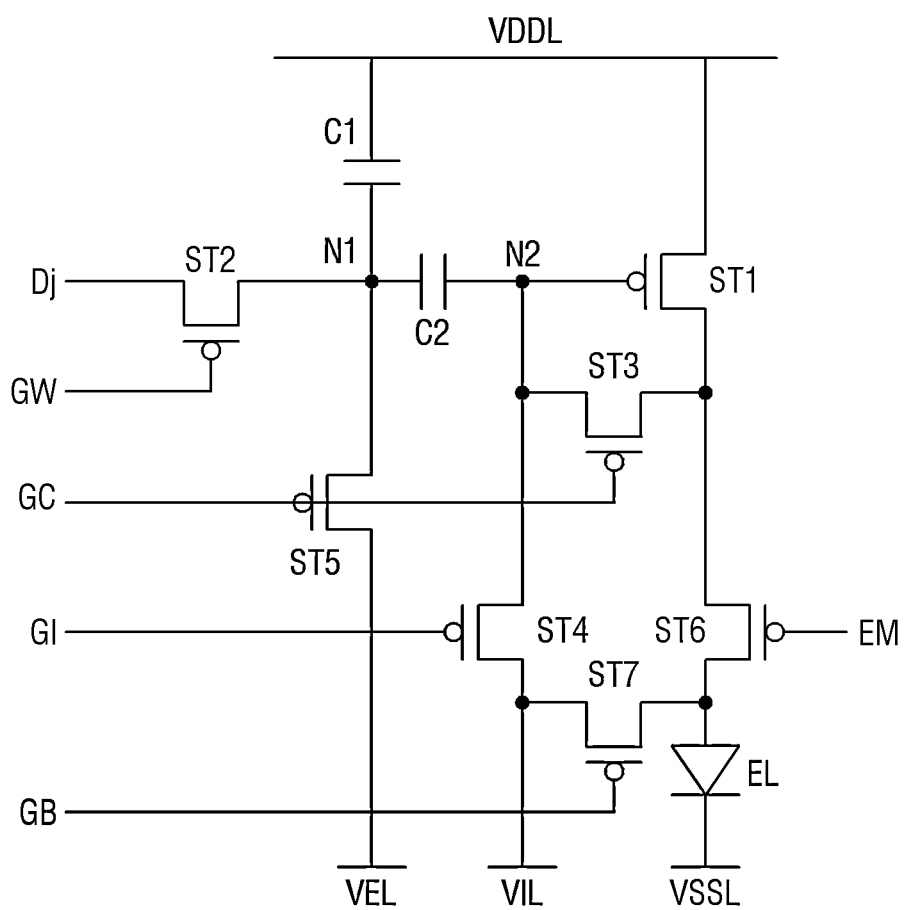
FIG. 4 is a schematic diagram of an equivalent circuit illustrating a sub-pixel according to an embodiment.

The scan driver 410 may generate scan signals in response to the scan control signal SCS and sequentially output the scan signals to the scan lines SL. The emission control driver 420 may generate emission control signals in response to the emission control signal ECS and sequentially output the emission control signals to the emission control lines EM. The scan lines SL may include first scan lines GI, second scan lines GC, third scan lines GW, and fourth scan lines GB as shown in FIG. 4.

The scan driving circuit 400 may include thin film transistors. The scan driving circuit 400 may be formed on the same layer as the thin film transistors of the sub-pixels SP. Although FIG. 2 illustrates that the scan driving circuit 400 is on one side of the display area DA, for example, in the non-display area NDA on the left side, the embodiments are not limited thereto. For example, the scan driving circuit 400 may be formed on both sides of the display area DA, for example, in the non-display area NDA on the left and right sides.

As shown in FIG. 3, the display driving circuit 200 may include a timing controller 210, a data driver 220, and a power supply unit 230.

The timing controller 210 receives digital video data DATA and timing signals from the circuit board 300. In response to the timing signals, the timing controller 210 may generate the scan control signal SCS for controlling the operation timing of the scan driver 410, the emission control signal ECS for controlling the operation timing of the emission control driver 420, and a data control signal DCS for controlling the operation timing of the data driver 220. The timing controller 210 may output the scan control signal SCS to the scan driver 410 and output the emission control signal ECS to the emission control driver 420, through the scan control lines. The timing controller 210 may output the digital video data DATA and the data control signal DCS to the data driver 220.

The data driver 220 converts the digital video data DATA into positive/negative analog data voltages and outputs them to the data lines DL through the fan-out lines. The sub-pixels SP are selected by the scan signals of the scan driving circuit 400, and the data voltages are supplied to the selected sub-pixels SP.

The power supply unit 230 may generate a first driving voltage and supply the first driving voltage ELVDD to the first driving voltage line VDDL. Further, the power supply unit 230 may generate a second driving voltage ELVSS and supply the second driving voltage to a cathode electrode of the organic light emitting diode of each of the sub-pixels SP. The first driving voltage ELVDD may be a high potential voltage for driving the organic light emitting diode, and the second driving voltage ELVSS may be a low potential voltage for driving the organic light emitting diode. The first driving voltage ELVDD may have a potential higher than that of the second driving voltage ELVSS.

The display driving circuit 200 may be an integrated circuit (IC) and attached onto the display panel 10 by a chip on glass (COG) method, a chip on plastic (COP) method, or an ultrasonic bonding method, but the disclosure is not limited thereto. For example, the display driving circuit 200 may be attached on the circuit board 300.

The circuit board 300 may be attached onto the pads DP using an anisotropic conductive film. Accordingly, lead wires of the circuit board 300 may be electrically connected to the pads DP. The circuit board 300 may be a flexible printed circuit board, a printed circuit board, or a flexible film such as a chip on film.

FIG. 4 is a schematic diagram of an equivalent circuit illustrating a sub-pixel according to an embodiment.

Referring to FIG. 4, the sub-pixel SP includes a driving transistor ST1, a light emitting element EL, switch elements, a first capacitor C1, a second capacitor C2, and the like. The switch elements include second to seventh transistors ST2, ST3, ST4, ST5, ST6, and ST7.

The sub-pixel SP may be electrically connected to the first scan line GI, the second scan line GC, the third scan line GW, the fourth scan line GB, and a data line Dj (j being a positive integer). Further, the sub-pixel SP may be electrically connected to the first driving voltage line VDDL to which the first driving voltage ELVDD is supplied, an initialization voltage line VIL to which an initialization voltage Vinit is supplied, a reference voltage line VEL to which a reference voltage Vref is supplied, and a second driving voltage line VSSL to which the second driving voltage ELVSS is applied. The sub-pixel SP may be electrically connected to the emission control line EM to which an emission signal is supplied.

The driving transistor ST1 controls a drain-source current Ids (hereinafter, referred to as "driving current") based on a data voltage applied to the gate electrode. The driving current Ids flowing through the channel of the driving transistor ST1 is proportional to the square of the difference between a gate-source voltage Vsg of the driving transistor ST1 and a threshold voltage as shown in Eq. 1.

$$Ids = k' \times (Vsg - Vth)^2 \qquad \text{Eq. 1}$$

In Eq. 1, k' is a proportional coefficient determined by the structure and physical characteristics of the driving transistor, Vsg is a gate-source voltage of the driving transistor, and Vth is a threshold voltage of the driving transistor.

The gate electrode of the driving transistor ST1 may be electrically connected to a second node N2, the first electrode thereof may be electrically connected to the first driving voltage line VDDL, and the second electrode thereof may be electrically connected to the first electrode of the third transistor ST3 and the first electrode of the sixth transistor ST6.

The light emitting element EL emits light by the driving current Ids. The light emitted by the light emitting element EL may be proportional to the driving current Ids.

The light emitting element EL may be an anode electrode, a cathode electrode, and an organic light emitting diode including an organic light emitting layer disposed between the anode electrode and the cathode electrode. In other examples, the light emitting element EL may be an anode electrode, a cathode electrode, and an inorganic light emitting element including an inorganic semiconductor disposed between the anode electrode and the cathode electrode. In other examples, the light emitting element EL may be an anode electrode, a cathode electrode, and a quantum dot light emitting element including a quantum dot light emitting layer disposed between the anode electrode and the cathode electrode. In other examples, the light emitting element EL may be a micro light emitting diode.

The anode electrode of the light emitting element EL may be electrically connected to the second electrode of the sixth transistor ST6 and the first electrode of the seventh transistor ST7, and the cathode electrode may be electrically connected to the second driving voltage line VSSL.

The second transistor ST2 is turned on by the third scan signal applied to the third scan line GW to electrically connect a first node N1 to the data line Dj. The gate electrode of the second transistor ST2 may be electrically connected to the third scan line GW, the first electrode thereof may be electrically connected to the first node N1, and the second electrode thereof may be electrically connected to the data line Dj.

The third transistor ST3 is turned on by the second scan signal applied to the second scan line GC to electrically connect the second node N2 electrically connected to the gate electrode of the driving transistor ST1 to the second electrode of the driving transistor ST1. When the third transistor ST3 is turned on, the gate electrode and the second electrode of the driving transistor ST1 are electrically connected, so that the driving transistor ST1 operates as a diode. The gate electrode of the third transistor ST3 may be electrically connected to the second scan line GC, the first electrode thereof may be electrically connected to the second electrode of the driving transistor ST1, and the second electrode thereof may be electrically connected to the second node N2.

The fourth transistor ST4 is turned on by the first scan signal applied to the first scan line GI to electrically connect the initialization voltage line VIL to the second node N2 electrically connected to the gate electrode of the driving transistor ST1. The gate electrode of the driving transistor ST1 may be discharged with the initialization voltage Vinit of the initialization voltage line VIL. The gate electrode of the fourth transistor ST4 may be electrically connected to the first scan line GI, the first electrode thereof may be electrically connected to the second node N2, and the second electrode thereof may be electrically connected to the initialization voltage line VIL.

The fifth transistor ST5 is turned on by the second scan signal applied to the second scan line GC to electrically connect the first node N1 to the reference voltage line VEL. The reference voltage Vref may be supplied to the other electrode of the first capacitor C1 and one electrode of the second capacitor C2. The gate electrode of the fifth transistor ST5 may be electrically connected to the second scan line GC, the first electrode thereof may be electrically connected to the first node N1, and the second electrode thereof may be electrically connected to the reference voltage line VEL.

The sixth transistor ST6 is turned on by the emission signal of the emission control line EM to connect the second electrode of the driving transistor ST1 to the anode electrode of the light emitting element EL. The gate electrode of the sixth transistor ST6 is electrically connected to the emission control line EM, the first electrode thereof is electrically connected to the second electrode of the driving transistor ST1, and the second electrode thereof is electrically connected to the anode electrode of the light emitting element EL. When the sixth transistor ST6 is turned on, the driving current Ids may be supplied to the light emitting element EL.

The seventh transistor ST7 is turned on by the fourth scan signal of the fourth scan line GB to electrically connect the anode electrode of the light emitting element EL to the initialization voltage line VIL. The light emitting element EL may be discharged with the initialization voltage Vinit of the initialization voltage line VIL. The gate electrode of the seventh transistor ST7 may be electrically connected to the fourth scan line GB, the first electrode thereof may be electrically connected to the initialization voltage line VIL, and the second electrode thereof may be electrically connected to the anode electrode of the light emitting element EL.

The first capacitor C1 is formed between the first driving voltage line VDDL and the first node N1. An electrode of the first capacitor C1 may be electrically connected to the first driving voltage line VDDL, and the other electrode thereof may be electrically connected to the first node N1. The first capacitor C1 may store a difference voltage between the first driving voltage line VDDL and the first node N1. Accordingly, the voltage difference between the first driving voltage line VDDL and the first node N1 may be maintained by the first capacitor C1.

The second capacitor C2 is formed between the first node N1 and the second node N2. An electrode of the second capacitor C2 may be electrically connected to the second node N2, and the other electrode thereof may be electrically connected to the first node N1. The second capacitor C2 may store the difference voltage between the first node N1 and the second node N2. Accordingly, the voltage difference between the first node N1 and the second node N2 may be maintained by the second capacitor C2.

As will be described below, the other electrode of the first capacitor C1 and the other electrode of the second capacitor C2 may be referred to as a common capacitor electrode CEC (refer to FIG. 17). The common capacitor electrode CEC may be a common capacitor electrode for the first capacitor C1 and the second capacitor C2. Further, an electrode of the first capacitor C1 may be referred to as a first capacitor electrode CE1 (refer to FIG. 17), and another electrode of the second capacitor C2 may be referred to as a second capacitor electrode CE2 (refer to FIG. 17).

The first node N1 may be the contact point of the first electrode of the second transistor ST2, the first electrode of the fifth transistor ST5, the other electrode of the first capacitor C1, and the other electrode of the second capacitor C2. The second node N2 may be the contact point of the gate electrode of the driving transistor ST1, the second electrode of the third transistor ST3, and the first electrode of the fourth transistor ST4.

When the first electrode of each of the second to seventh transistors ST2 to ST7 and the driving transistor ST1 is a source electrode, the second electrode thereof may be a drain electrode. In other examples, when the first electrode of each of the second to seventh transistors ST2 to ST7 and the driving transistor ST1 is a drain electrode, the second electrode thereof may be a source electrode.

The active layer of each of the second to seventh transistors ST2 to ST7 and the driving transistor ST1 may include at least one of polysilicon, amorphous silicon, and an oxide semiconductor. When the active layer of each of the second to seventh transistors ST2 to ST7 and the driving transistor ST1 includes polysilicon, it may be formed by a low temperature polysilicon (LTPS) process.

Although FIG. 4 illustrates the driving transistor ST1 and the second to seventh transistors ST2 to ST7 as P-type metal oxide semiconductor field effect transistors (MOSFETs), the disclosure is not limited thereto, and they may be N-type MOSFETs. When the driving transistor ST1 and the second to seventh transistors ST2 to ST7 are formed as the N-type MOSFETs, the timing diagram of FIG. 5 should be modified in accordance with the characteristics of the N-type MOSFET.

The first driving voltage ELVDD of the first driving voltage line VDDL, the second driving voltage ELVSS of the second driving voltage line VSSL, the initialization voltage Vinit of the initialization voltage line VIL, and the reference voltage Vref of the reference voltage line VEL may be set in consideration of the characteristics of the driving transistor ST1 and the characteristics of the light emitting element EL. For example, the voltage difference between the initialization voltage Vinit and the first driving voltage ELVDD provided to the source electrode of the driving transistor ST1 may be set to be smaller than the threshold voltage of the driving transistor ST1.

Figure 5:
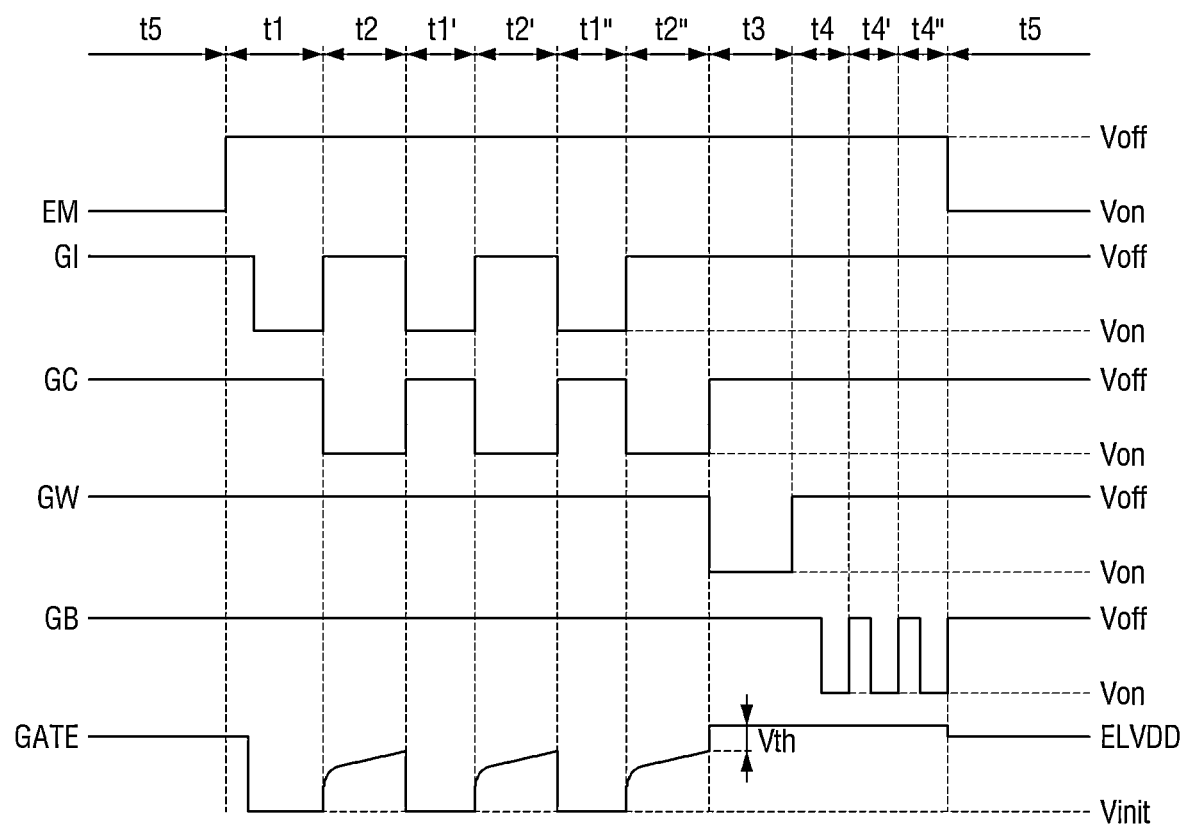
FIG. 5 is a waveform diagram illustrating signals applied to the first to fourth scan lines and the emission lines and the voltage of the second node in FIG. 4.

FIG. 5 is a waveform diagram illustrating signals applied to the first to fourth scan lines and the emission lines and the voltage of the second node in FIG. 4.

Referring to FIG. 5, the third scan signal applied to the third scan line GW is the signal for controlling turn-on and turn-off of the second transistor ST2. The second scan signal applied to the second scan line GC is the signal for controlling turn-on and turn-off of the third transistor ST3 and the fifth transistor ST5. The first scan signal applied to the first scan line GI is the signal for controlling turn-on and turn-off of the fourth transistor ST4. The fourth scan signal applied to the fourth scan line GB is the signal for controlling turn-on and turn-off of the seventh transistor ST7. The emission signal applied to the emission control line EM is the signal for controlling the sixth transistor ST6.

The first to fourth scan signals applied to the first to fourth scan lines GI, GC, GW, and GC and the emission signal applied to the emission control line EM may be generated at intervals of one frame period. One frame period may be divided into first to fifth periods t1 to t5. The first period t1 is the period in which the gate electrode of the driving transistor ST1 is initialized, the second period t2 is the period in which the threshold voltage of the driving transistor ST1 is sampled, the third period t3 is the period in which a data voltage is supplied to the first node N1, the fourth period t4 is the period in which the anode electrode is initialized, and the fifth period t5 is the period in which the light emitting element EL emits light.

The first period t1 may include multiple first periods t1, t1', and t1", and the second period t2 may include multiple second periods t2, t2', and t2". The first periods t1, t1', and t1" and the second periods t2, t2', and t2" may be alternately repeated. For example, the first periods t1, t1', and t1" and the second periods t2, t2', and t2" may be arranged in the order of the first period t1, the second period t2, the first period t1', the second period t2', the first period t1", and the second period t2". Further, the fourth period t4 may include multiple fourth periods t4, t4', and t4". A detailed description thereof will be described with reference to FIG. 11. In FIGS. 5 to 10, the first period t1 refers to all first periods t1, t1', and t1", the second period t2 refers to all second periods t2, t2', and t2", and the fourth period t4 refers to all fourth periods t4, t4', and t4".

The first scan signal applied to the first scan line GI, the second scan signal applied to the second scan line GC, the third scan signal applied to the third scan line GW, and the fourth scan signal applied to the fourth scan line GB may be sequentially outputted with a gate-on voltage Von during the first to fourth periods t1, t2, t3, and t4.

For example, the first scan signal applied to the first scan line GI may have the gate-on voltage Von during the first period t1 and may have a gate-off voltage Voff during the remaining periods. The second scan signal applied to the second scan line GC may have the gate-on voltage Von during the second period t2 and may have the gate-off voltage Voff during the remaining periods. The third scan signal applied to the third scan line GW may have the gate-on voltage Von during the third period t3 and may have the gate-off voltage Voff during the remaining periods. The fourth scan signal applied to the fourth scan line GB may have the gate-on voltage Von during the fourth period t4 and may have the gate-off voltage Voff during the remaining periods.

Although FIG. 5 illustrates that the period in which the first scan signal applied to the first scan line GI has the gate-on voltage Von is shorter than the first period t1 and is substantially the same as the first periods t1' and t1", each of the first periods t1, t1', and t1" may be substantially the same as the period in which the first scan signal has the gate-on voltage Von.

The emission signal may have the gate-on voltage Von during the fifth period t5 and may have the gate-off voltage Voff during the remaining periods.

In FIG. 5, it is illustrated that each of the first period t1, the second period t2, the third period t3, and the fourth period t4 is one horizontal period. Since one horizontal period indicates the period in which the data voltage is supplied to each of the sub-pixels SP connected to a certain scan line of the display panel 10, it may be defined as one horizontal line scan period. The data voltages may be supplied to the data lines Dj in synchronization with the gate-on voltage Von of each of the scan signals.

The gate-on voltage Von corresponds to the turn-on voltage capable of turning on each of the second to seventh transistors ST2 to ST7 and the driving transistor ST1. The gate-off voltage Voff corresponds to the turn-off voltage capable of turning off each of the second to seventh transistors ST2 to ST7 and the driving transistor ST1.

FIGS. 6 to 10 are schematic diagrams of equivalent circuits illustrating a method of driving a sub-pixel during the first to fifth periods of FIG. 5.

Hereinafter, the operation of the sub-pixel SP during the first to fifth periods t1 to t5 will be described in detail with reference to FIGS. 5 to 10.

Figure 6:
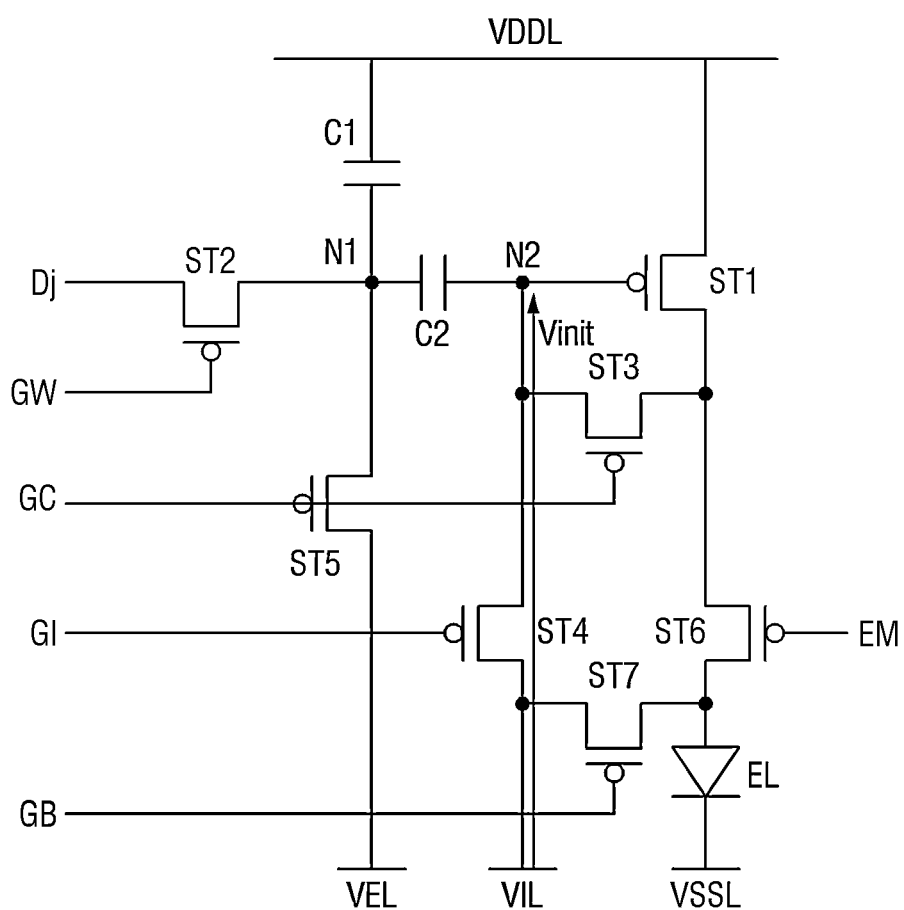
FIGS. 6 to 10 are schematic diagrams of equivalent circuits illustrating a method of driving a sub-pixel during the first to fifth periods of FIG. 5.

First, the first scan signal having the gate-on voltage Von is supplied to the first scan line GI during the first period t1. During the first period t1, as shown in FIG. 6, the fourth transistor ST4 is turned on by the first scan signal having the gate-on voltage Von. Due to the turn-on of the fourth transistor ST4, the second node N2 is initialized to the initialization voltage Vinit.

Figure 7:
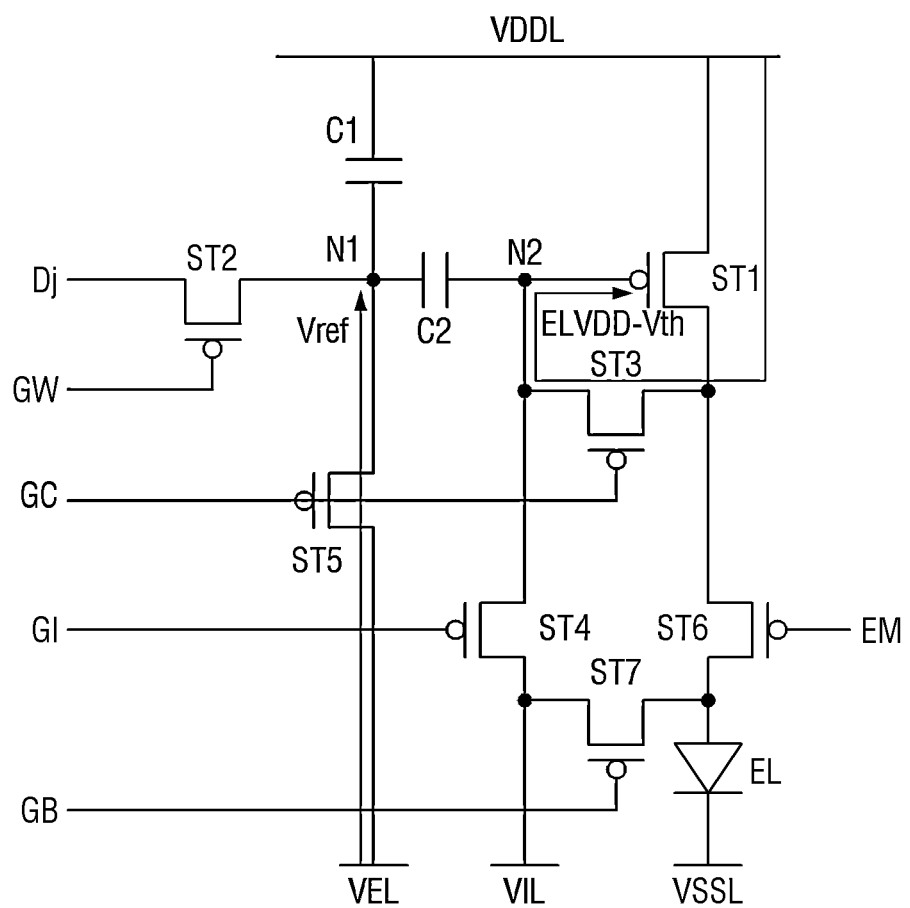

The second scan signal having the gate-on voltage Von is supplied to the second scan line GC during the second period t2. During the second period t2, as shown in FIG. 7, each of the third transistor ST3 and the fifth transistor ST5 is turned on by the second scan signal having the gate-on voltage Von.

Due to the turn-on of the third transistor ST3, the gate electrode and the second electrode of the driving transistor ST1 are electrically connected to each other, and the driving transistor ST1 operates as a diode. The voltage difference (Vsg=ELVDD−Vinit) between the gate electrode and the source electrode (e.g., the first electrode) of the driving transistor ST1 is greater than the threshold voltage Vth, so that the driving transistor ST1 forms a current path until the voltage difference Vsg between the source electrode and the gate electrode reaches the threshold voltage Vth. Accordingly, the voltage Vg of the gate electrode of the driving transistor ST1 increases up to the difference voltage (ELVDD−Vth) between the first driving voltage ELVDD and the threshold voltage Vth of the driving transistor ST1 during the second period t2.

The reference voltage Vref is supplied to the first node N1 due to the turn-on of the fifth transistor ST5. "ELVDD−Vref" may be stored in the first capacitor C1 and "ELVDD−Vth−Vref" may be stored in the second capacitor C2.

Figure 8:
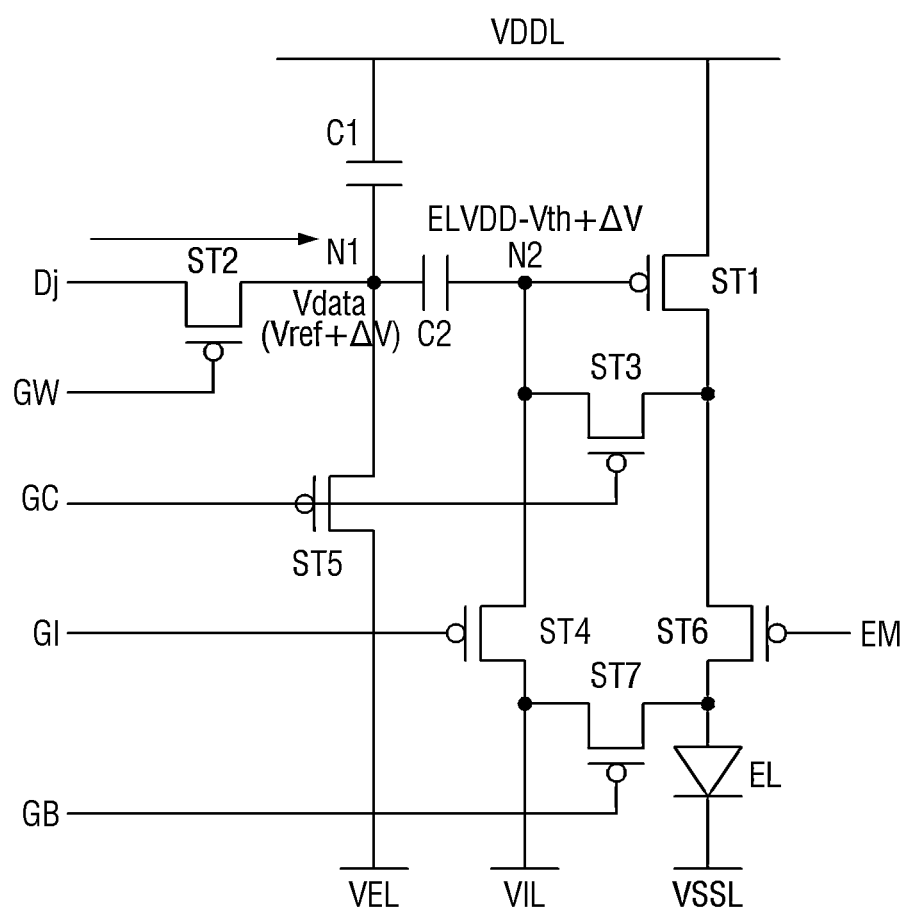

The third scan signal having the gate-on voltage Von is supplied to the third scan line GW during the third period t3. During the third period t3, as shown in FIG. 8, the second transistor ST2 is turned on by the third scan signal having the gate-on voltage Von. The data voltage Vdata is supplied to the first node N1 due to the turn-on of the second transistor ST2. The voltage of the first node N1 may be changed to "Vref+ΔV," and the voltage of the second node N2 may be changed to "ELVDD−Vth+ΔV" because the voltage variation ΔV of the first node N1 is reflected in the second node N2 by the second capacitor C2. "ELVDD-Vdata" may be stored in the first capacitor C1. The voltage difference ELVDD-Vth-Vref between the second node N2 and the first node N1 may be maintained by the second capacitor C2.

Figure 9:
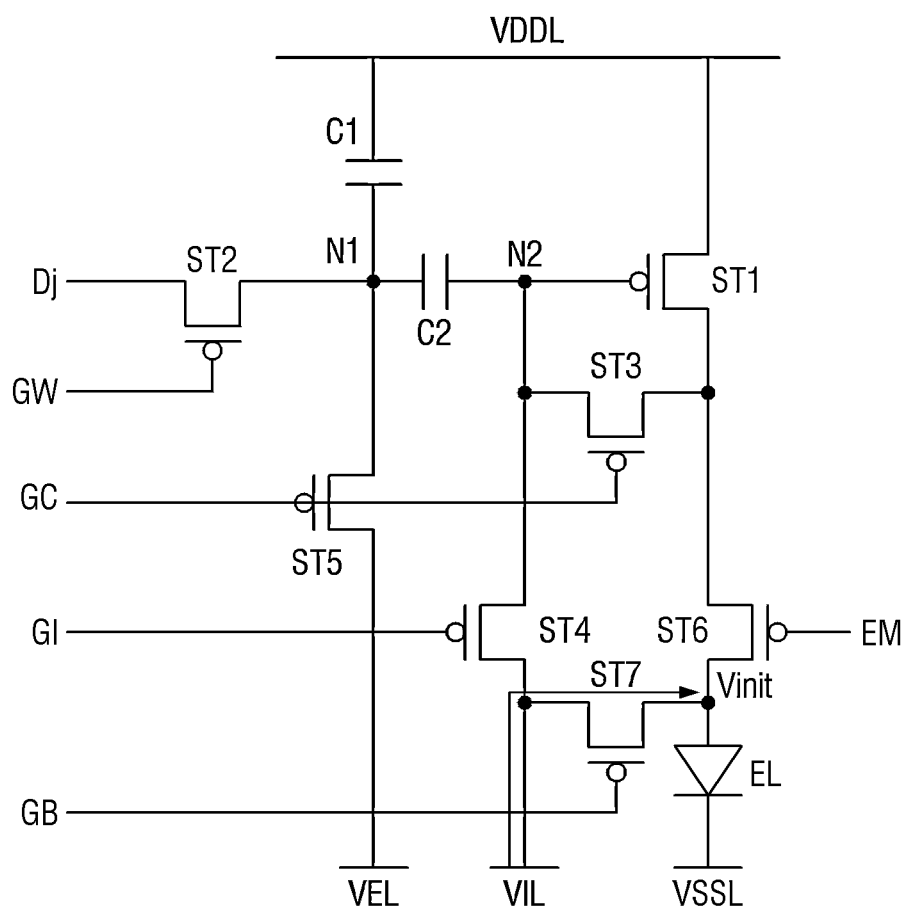

The fourth scan signal having the gate-on voltage Von is supplied to the fourth scan line GB during the fourth period t4. During the fourth period t4, as shown in FIG. 9, the seventh transistor ST7 is turned on by the fourth scan signal having the gate-on voltage Von. Due to the turn-on of the seventh transistor ST7, the anode electrode of the light emitting element EL is initialized to the initialization voltage Vinit.

Figure 10:
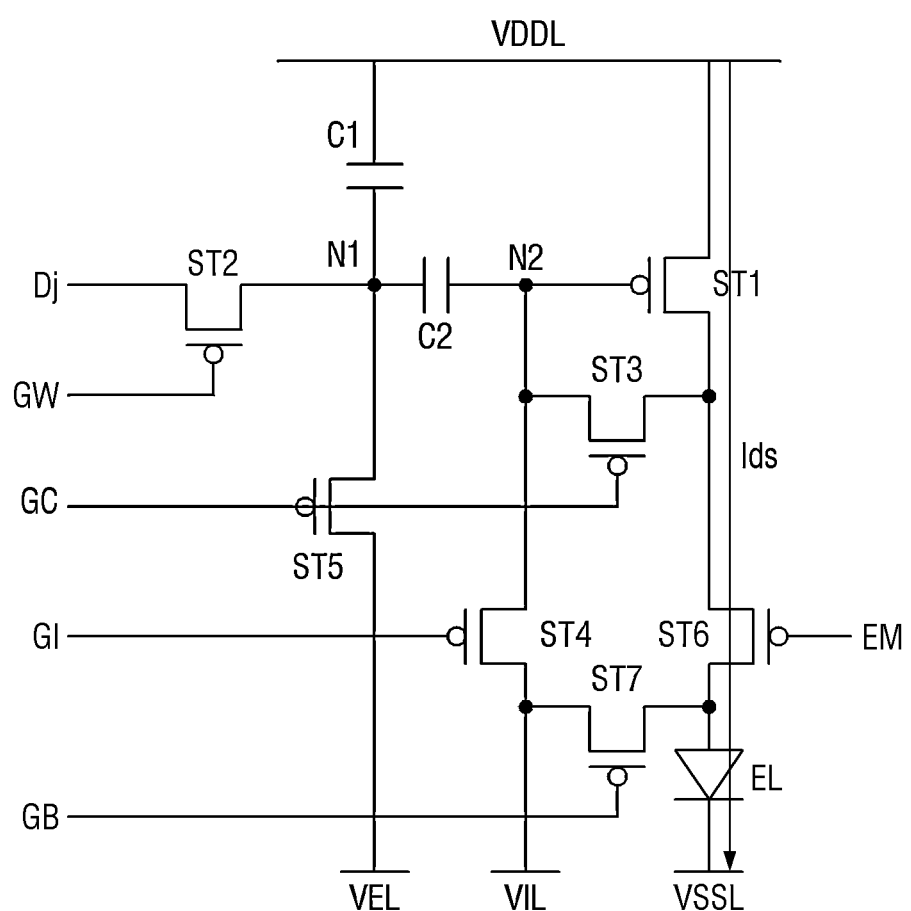

The emission signal having the gate-on voltage Von is supplied to the emission control line EM during the fifth period t5. During the fifth period t5, as shown in FIG. 10, the sixth transistor ST6 is turned on by the emission signal having the gate-on voltage Von. Due to the turn-on of the sixth transistor ST6, the second electrode of the driving transistor ST1 is connected to the anode electrode of the light emitting element EL.

When the sixth transistor ST6 is turned on, the driving current Ids flowing according to the voltage of the gate electrode of the driving transistor ST1 may be supplied to the light emitting element EL. The driving current Ids may be defined as in Eq. 2.

$$Ids = k' \times (ELVDD-(ELVDD-Vth+\Delta V)-Vth)^2 \qquad \text{Eq. 2}$$

In Eq. 2, k' indicates a proportional coefficient determined by the structure and physical characteristics of the driving transistor ST1, Vth indicates the threshold voltage of the driving transistor ST1, ELVDD indicates the first driving voltage, and Vdata indicates the data voltage. The gate voltage of the driving transistor ST1 is (ELVDD−Vth+ΔV), and the voltage of the first electrode is ELVDD. Eq. 3 is derived from simplifying Eq. 2.

$$Ids = k' \times \Delta V^2 = k' \times (Vdata - Vref)^2 \qquad \text{Eq. 3}$$

Consequently, as illustrated in Eq. 3, the driving current Ids does not depend on the threshold voltage Vth of the driving transistor ST1. The threshold voltage Vth of the driving transistor ST1 is compensated.

Figure 11:
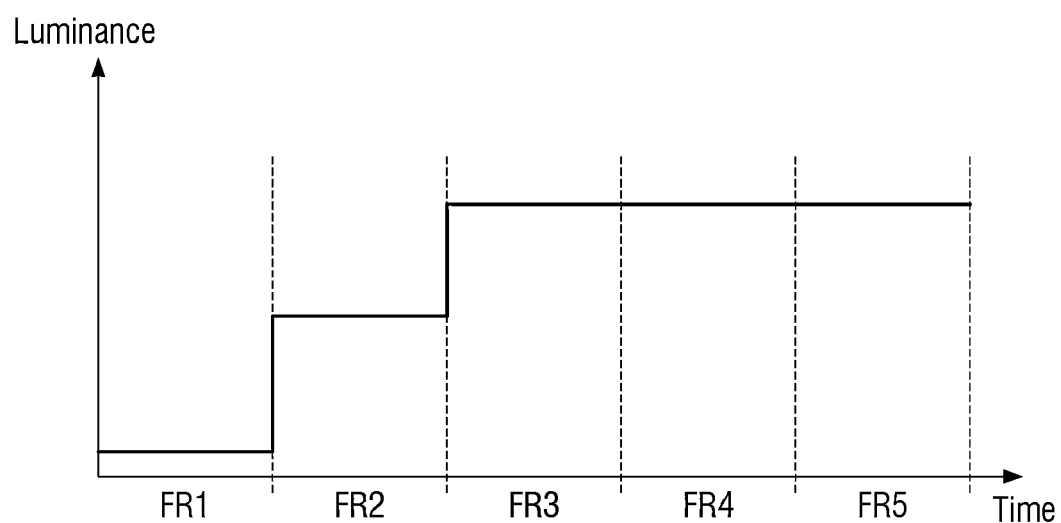
FIG. 11 is a graph showing a stepwise increase in the luminance of the light emitting element due to the hysteresis characteristic of the driving transistor.

FIG. 11 is a graph showing a stepwise increase in the luminance of the light emitting element due to the hysteresis characteristic of the driving transistor.

In the case of displaying black luminance and then white luminance, the driving current Ids of the driving transistor ST1 increases in a stepwise manner due to the hysteresis characteristic of the driving transistor ST1. Accordingly, the luminance of the light emitting element EL also increases in a stepwise manner. In FIG. 11, the first frame period FR1 corresponds to a black display period in which the light emitting element EL emits light with the black luminance, and the second to fourth frame periods FR2 to FR4 correspond to a white display period in which the light emitting element EL emits light with the white luminance. In FIG. 11, the X-axis indicates time, and the Y-axis indicates the luminance of the light emitting element EL.

When the light emitting element EL displays the black luminance, the curve of the driving current Ids of the driving transistor ST1 may be positively shifted, and when the light emitting element EL displays the white luminance, the curve of the driving current Ids of the driving transistor ST1 may be negatively shifted. When the light emitting element EL displays the black luminance and then the white luminance, the curve of the driving current Ids of the driving transistor ST1 may be negatively shifted gradually. Therefore, even when the same data voltage is applied, the driving current Ids of the driving transistor ST1 supplied to the light emitting element EL increases in a stepwise manner during the second to fourth frame periods FR2 to FR4. Accordingly, as shown in FIG. 11, the luminance of the light emitted from the light emitting element EL also increases in a stepwise manner during the second to fourth frame periods FR2 to FR4.

In order to reduce the luminance difference between the frame periods FR1 to FR5, which is caused by the stepwise increase in the luminance of the light emitting element EL due to the hysteresis characteristic of the driving transistor ST1, an on bias is applied to the driving transistor ST1 in each of the first periods t1, t1', and t1". When the initialization voltage Vinit is applied to a gate electrode G1 of the driving transistor ST1 in each of the first periods t1, t1', and t1", the driving transistor ST1 may be turned on because the voltage difference between the gate electrode G1 and the first electrode of the driving transistor ST1 is smaller than the threshold voltage Vth of the driving transistor ST1. The on bias may be applied to the driving transistor ST1.

Since the first periods t1, t1', and t1" and the second periods t2, t2', and t2" are alternately repeated as shown in FIG. 5, the on bias may be applied to the driving transistor ST1 in each of the first periods t1, t1', and t1". Therefore, when one frame period includes the first periods t1, t1', and t1", it is possible to further suppress the stepwise increase in the luminance of the light emitting element EL due to the hysteresis characteristics of the driving transistor ST1, compared to when one frame period includes one first period.

In FIG. 5, the fourth period t4 may include the fourth periods t4, t4', and t4". A flicker phenomenon may be prevented by driving each of the fourth periods t4, t4', and t4" by the fourth scan signals having different frequencies. The flicker phenomenon may be prevented by reducing the difference between the initial value and the last value of the on-bias of the driving transistor ST1.

Figure 12:
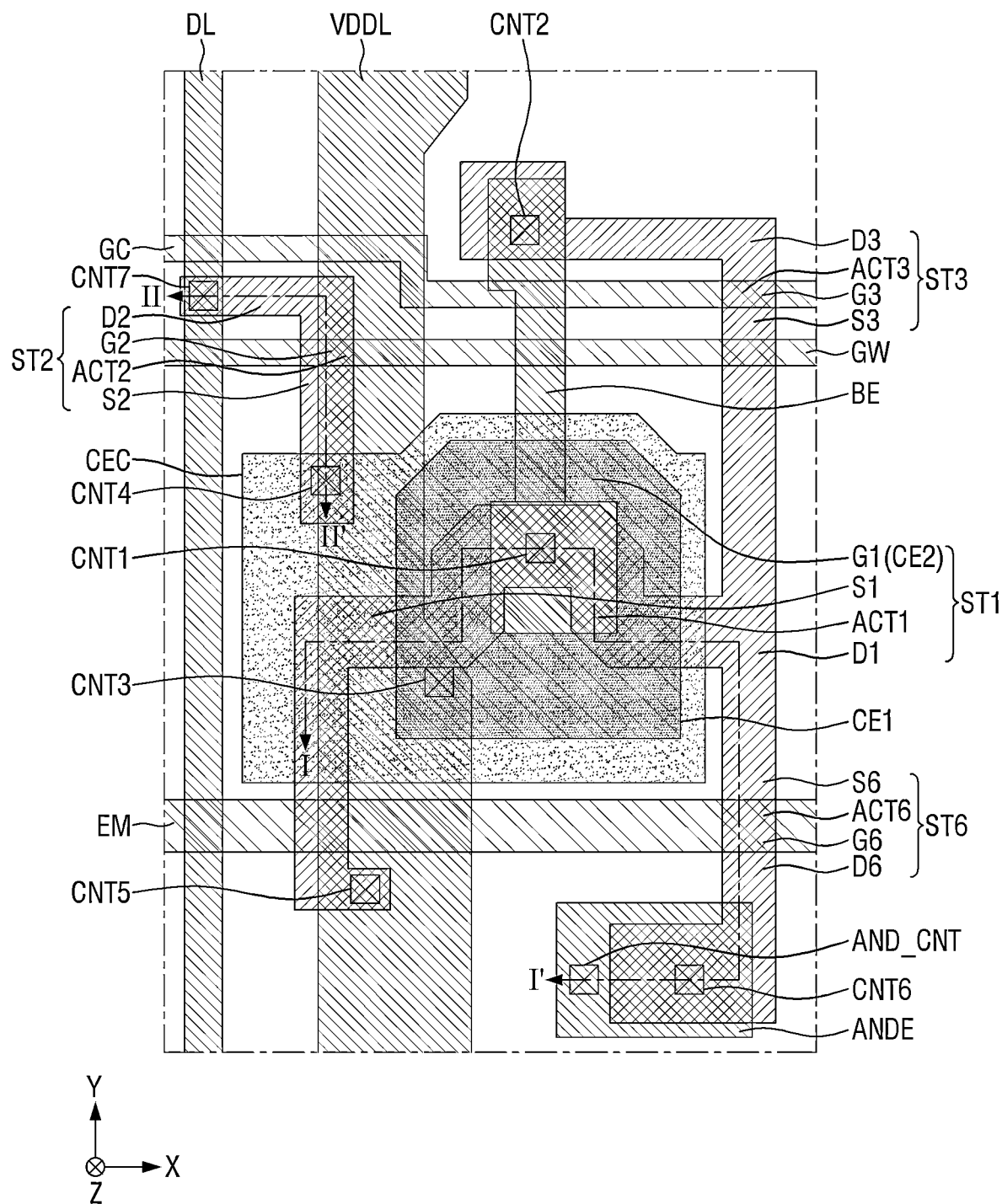
FIG. 12 is a schematic plan view showing a sub-pixel according to an embodiment.
Figure 13:
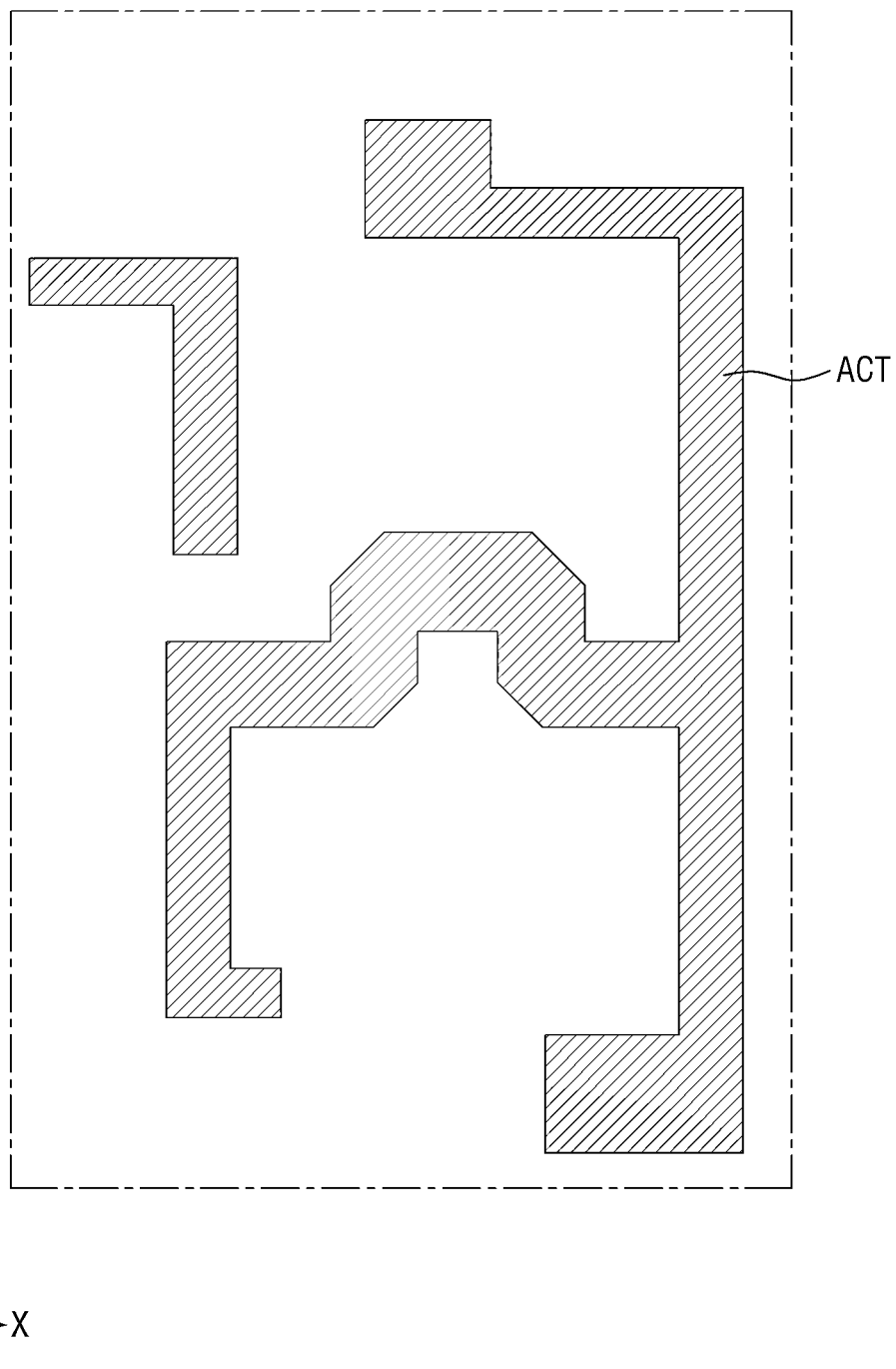
FIG. 13 is a schematic plan view illustrating the active layer of the sub-pixel of FIG. 12.
Figure 14:
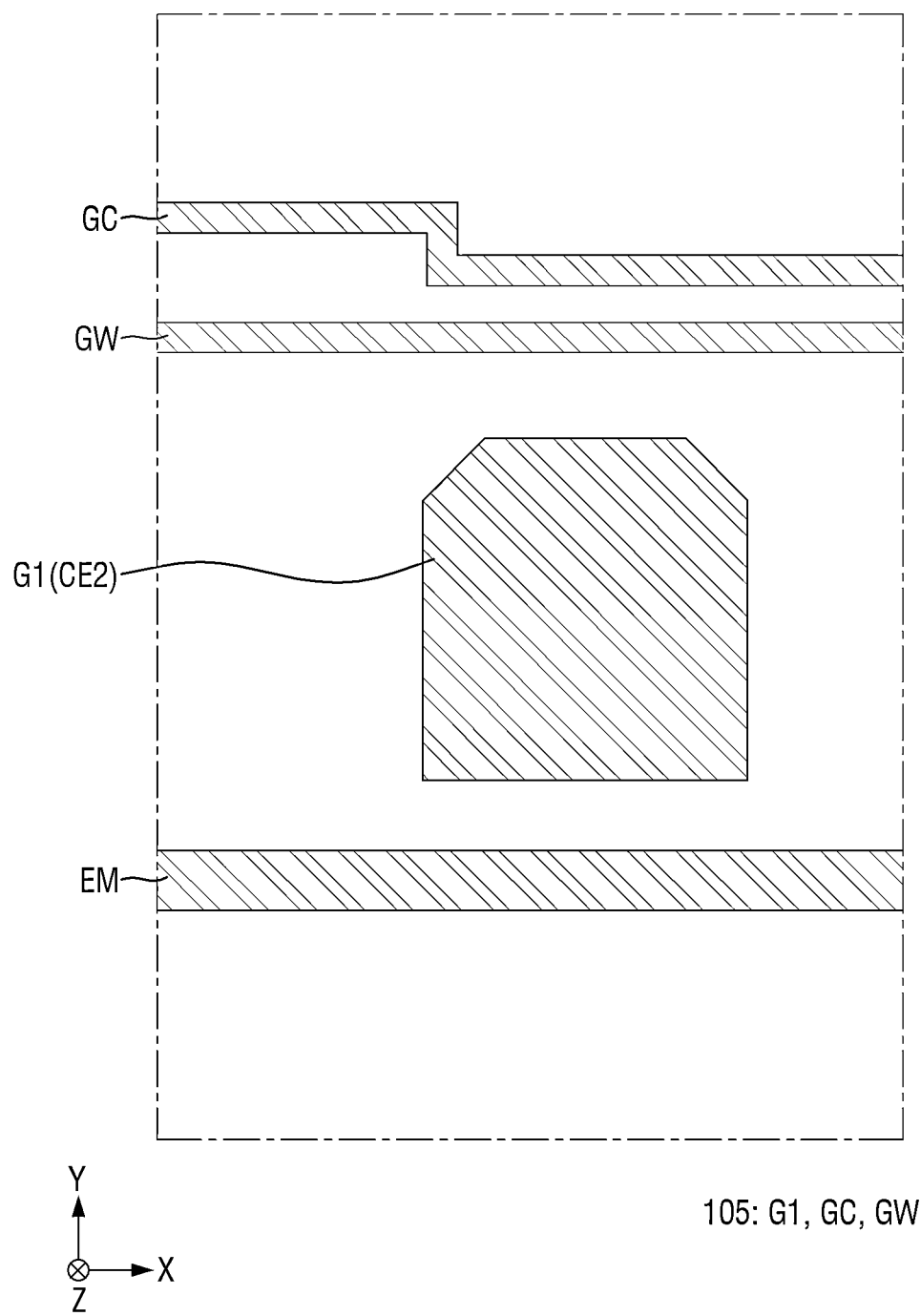
FIG. 14 is a schematic plan view illustrating the first gate layer of the sub-pixel of FIG. 12.
Figure 15:
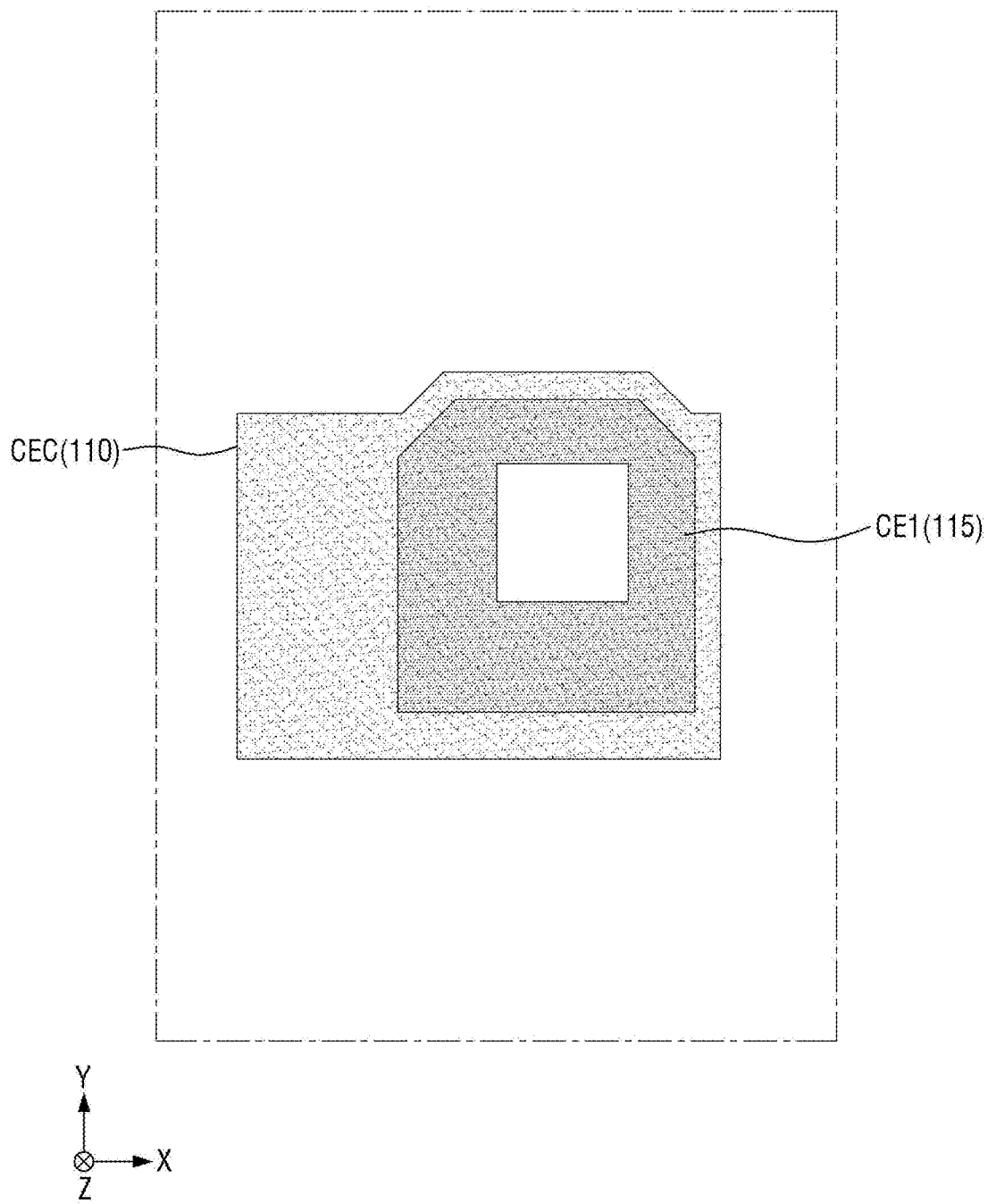
FIG. 15 is a schematic plan view illustrating the second gate layer and the third gate layer of the sub-pixel of FIG. 12.
Figure 16:
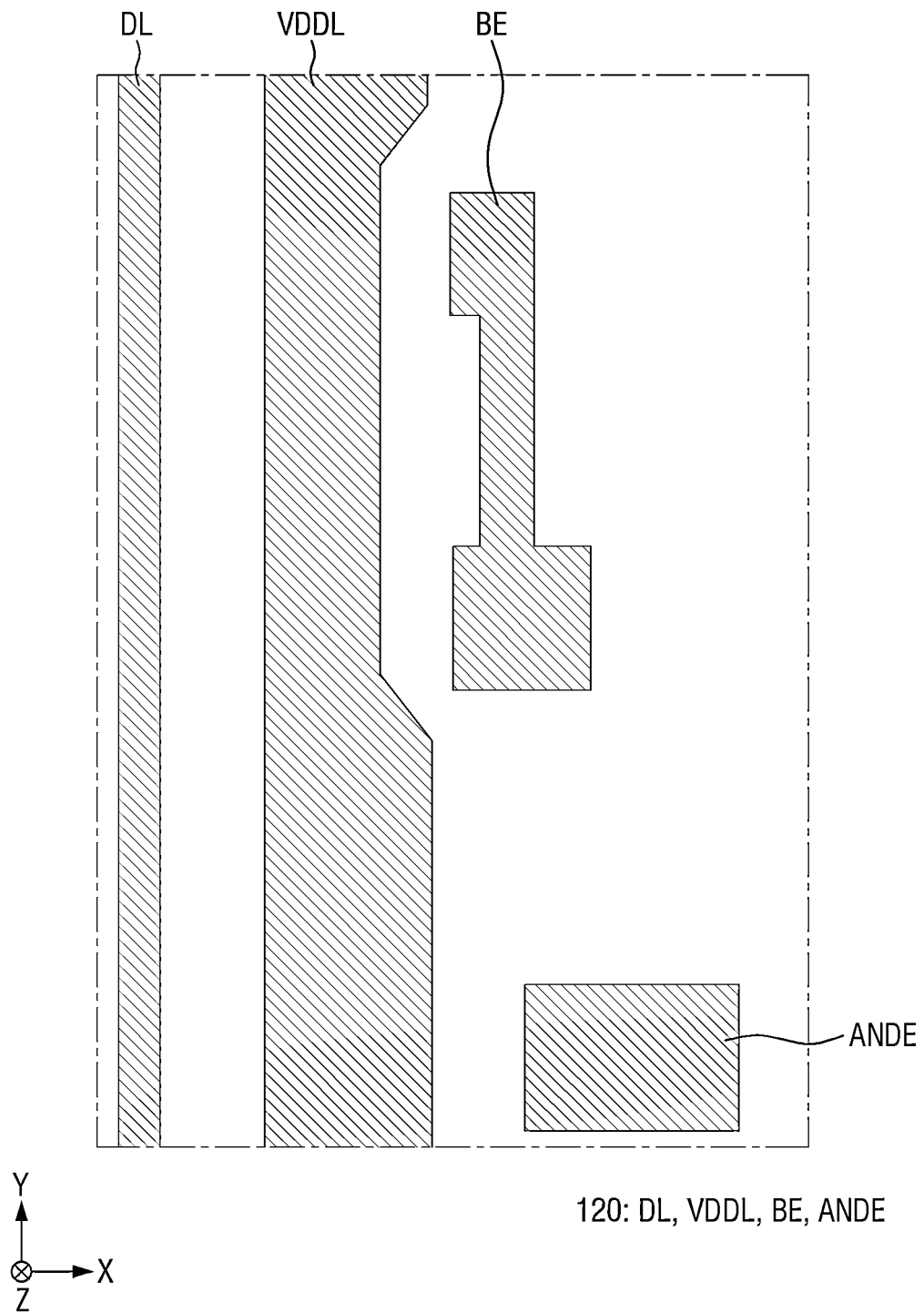
FIG. 16 is a schematic plan view illustrating the data metal layer of the sub-pixel of FIG. 12.

FIG. 13 is a schematic plan view illustrating the active layer of the sub-pixel of FIG. 12, FIG. 14 is a schematic plan view illustrating the first gate layer of the sub-pixel of FIG. 12, FIG. 15 is a schematic plan view illustrating the second gate layer and the third gate layer of the sub-pixel of FIG. 12, and FIG. 16 is a schematic plan view illustrating the data metal layer of the sub-pixel of FIG. 12. The plan views of the driving transistor ST1, the second transistor ST2, the third transistor ST3, and the sixth transistor ST6, and the first and second capacitors C1 and C2 are illustrated in the drawings.

Referring to FIGS. 12 to 16, the sub-pixel SP may include the driving transistor ST1, the second to seventh transistors ST2 to ST7, the first capacitor C1, and the second capacitor C2. Hereinafter, they will be described in conjunction with the active layer ACT, the first to third gate layers 105, 110, and 115, and the data metal layer 120 on which they are formed.

In FIGS. 12 and 13, the active layer ACT may include the driving transistor ST1, and the channel regions, the first electrodes, and the second electrodes of the second to seventh transistors ST2 to ST7.

In FIGS. 12 and 14, the first gate layer 105 disposed on the active layer ACT may include the gate electrode G1, the second scan line GC, and the third scan line GW of the driving transistor ST1, and the emission control line EM. The second scan line GC, the third scan line GW, and the emission control line EM may extend in the first direction (X-axis direction). The second scan line GC, the third scan line GW, and the emission control line EM may be sequentially disposed in a direction opposite to the second direction (Y-axis direction). The gate electrode G1 of the driving transistor ST1 may be disposed between the third scan line GW and the emission control line EM, and may overlap the active layer ACT in a third direction (Z-axis direction).

In FIGS. 12 and 15, the second gate layer 110 disposed on the first gate layer 105 may include the common capacitor electrode CEC. The third gate layer 115 disposed on the second gate layer 110 may include a first capacitor electrode CE1.

The common capacitor electrode CEC may overlap the gate electrode G1 (or the second capacitor electrode CE2) of the driving transistor ST1 and the first capacitor electrode CE1 in the third direction (Z-axis direction). The common capacitor electrode CEC and the first capacitor electrode CE1 may be disposed between the third scan line GW and the emission control line EM.

The area of the common capacitor electrode CEC may be greater than that of the second capacitor electrode CE2 or that of the first capacitor electrode CE1. Accordingly, the common capacitor electrode CEC may include the region that does not overlap the first capacitor electrode CE1 and the second capacitor electrode CE2, and may be electrically connected to a first electrode S2 of the second transistor ST2 through a fourth contact hole CNT4 in that region.

In FIGS. 12 and 16, the data metal layer 120 disposed on the third gate layer 115 may include the data line DL, the first driving voltage line VDDL, a connection electrode BE, and an anode connection electrode ANDE of the light emitting element EL. The data line DL and the first driving voltage line VDDL may extend in the second direction (Y-axis direction).

The first driving voltage line VDDL may intersect the second scan line GC, the third scan line GW, and the emission control line EM, and may overlap the active layer ACT in the third direction (Z-axis direction).

A part of the connection electrode BE may overlap each of the common capacitor electrode CEC, the gate electrode G1 of the driving transistor ST1, and the active layer ACT in the third direction (Z-axis direction), and may intersect the third scan line GW.

The anode connection electrode ANDE may overlap each of the emission control line EM and the active layer ACT in the third direction (Z-axis direction).

In FIG. 12, the driving transistor ST1 may include an active layer ACT1, the gate electrode G1, a first electrode S1, and a second electrode D1. The active layer ACT1 of the driving transistor ST1 may overlap the gate electrode G1 of the driving transistor ST1. The gate electrode G1 of the driving transistor ST1 may overlap the connection electrode BE. The gate electrode G1 of the driving transistor ST1 may be disposed under the connection electrode BE, and the gate electrode G1 and the connection electrode BE may be electrically connected to each other through a first contact hole CNT1. The gate electrode G1 of the driving transistor ST1 may overlap the active layer ACT1 of the driving transistor ST1. The first electrode S1 of the driving transistor ST1 may be electrically connected to the first driving voltage line VDDL through a fifth contact hole CNT5. The second electrode D1 of the driving transistor ST1 may be electrically connected to a first electrode S3 of the third transistor ST3 and a first electrode S6 of the sixth transistor ST6.

The second transistor ST2 may include an active layer ACT2, a gate electrode G2, the first electrode S2, and a second electrode D2. The gate electrode G2 of the second transistor ST2, which is a part of the third scan line GW, may be the overlapping region of the active layer ACT2 of the second transistor ST2 and the third scan line GW. The first electrode S2 of the second transistor ST2 may be electrically connected to the common capacitor electrode CEC through the fourth contact hole CNT4. The second electrode D2 of the second transistor ST2 may be electrically connected to the data line DL through a seventh contact hole CNT7.

The third transistor ST3 may include an active layer ACT3, a gate electrode G3, a first electrode S3, and a second electrode D3. The gate electrode G3 of the third transistor ST3, which is a part of the second scan line GC, may be the overlapping region of the active layer ACT3 of the third transistor ST3 and the second scan line GC. The first electrode S3 of the third transistor ST3 may be electrically connected to the second electrode D1 of the driving transistor ST1. The second electrode D3 of the third transistor ST3 may be electrically connected to the connection electrode BE through a second contact hole CNT2.

The fourth transistor ST4 (not illustrated in FIGS. 12-16) may include an active layer, a gate electrode, a first electrode, and a second electrode. The gate electrode of the fourth transistor ST4, which is a part of the first scan line GI (not illustrated in FIGS. 12-16), may be the overlapping region of the active layer of the fourth transistor ST4 and the first scan line GI. The first electrode of the fourth transistor ST4 may be electrically connected to the connection electrode BE and the second electrode D3 of the third transistor ST3 through the second contact hole CNT2. The second electrode of the fourth transistor ST4 may be electrically connected to the second electrode of the seventh transistor ST7 (not illustrated in FIGS. 12-16), and may be connected to the initialization voltage line VIL (not illustrated in FIGS. 12-16) through a contact hole.

The fifth transistor ST5 (not illustrated in FIGS. 12-16) may include an active layer, a gate electrode, a first electrode, and a second electrode. The gate electrode of the fifth transistor ST5, which is a part of the second scan line GC, may be the overlapping region of the active layer of the fifth transistor ST5 and the second scan line GC. The first electrode of the fifth transistor ST5 may be connected to the common capacitor electrode CEC, and the second electrode of the fifth transistor ST5 may be connected to the reference voltage line VEL (not illustrated in FIGS. 12-16).

The sixth transistor ST6 may include an active layer ACT6, a gate electrode G6, a first electrode S6, and a second electrode D6. The gate electrode G6 of the sixth transistor ST6, which is a part of the emission control line EM, may be the overlapping region of the active layer ACT6 of the sixth transistor ST6 and the emission control line EM. The first electrode S6 of the sixth transistor ST6 may be connected to the second electrode D1 of the driving transistor ST1. The second electrode D6 of the sixth transistor ST6 may be connected to the anode connection electrode ANDE of the light emitting element through a sixth contact hole CNT6. An anode electrode 171 (refer to FIG. 17) of the light emitting element may be connected to the anode connection electrode ANDE through an anode contact hole AND_CNT.

The seventh transistor ST7 (not illustrated in FIGS. 12-16) may include an active layer, a gate electrode, a first electrode, and a second electrode. The gate electrode of the seventh transistor ST7, which is a part of the fourth scan line GB (not illustrated in FIGS. 12-16), may be the overlapping region of the active layer of the seventh transistor ST7 and the fourth scan line GB. The first electrode of the seventh transistor ST7 may be connected to the second electrode D6 of the sixth transistor ST6. The second electrode of the seventh transistor ST7 may be connected to the second electrode of the fourth transistor ST4, and may be connected to the initialization voltage line VIL.

One electrode of the first capacitor C1 (refer to FIG. 17) may be the first capacitor electrode CE1 overlapping the first driving voltage line VDDL, and the other electrode of the first capacitor C1 may be the common capacitor electrode CEC overlapping the first electrode S1 of the driving transistor ST1. The first capacitor electrode CE1 may be electrically connected to the first driving voltage line VDDL through a third contact hole CNT3. Further, the common capacitor electrode CEC may be electrically connected to the first electrode S1 of the second transistor ST2 through the fourth contact hole CNT4.

One electrode of the second capacitor C2 (refer to FIG. 17) may be the second capacitor electrode CE2 corresponding to a part of the gate electrode G1 of the driving transistor ST1, and the other electrode of the second capacitor C2 may be the common capacitor electrode CEC overlapping the first capacitor electrode CE1.

The second capacitor electrode CE2, the common capacitor electrode CEC, and the first capacitor electrode CE1 may be sequentially stacked in the third direction (Z-axis direction), and may include overlapping portions. The overlapping area of the second capacitor electrode CE2 and the common capacitor electrode CEC and the overlapping area of the first capacitor electrode CE1 and the common capacitor electrode CEC may be substantially the equal size. Since the first capacitor C1 and the second capacitor C2 share the common capacitor electrode CEC, the area of the second capacitor electrode CE2 and the area of the first capacitor electrode CE1 may be substantially the same. Accordingly, the capacitance of the first capacitor C1 and the capacitance of the second capacitor C2 may be substantially the same.

In an embodiment, even when multiple capacitors are disposed in one sub-pixel SP, the capacitor electrodes are sequentially stacked to overlap each other, so that the area occupied in the horizontal direction may be maintained at a constant level or reduced. For example, even when the first capacitor C1 and the second capacitor C2 are both in one sub-pixel SP, the capacitor electrodes CE2, CEC, and CE1 overlap in the third direction (Z-axis direction), so that the capacitors may be formed without increasing the horizontal area (in the X-axis direction or Y-axis direction). As a result, the area occupied by the capacitor may be reduced, and the area occupied by one sub-pixel SP may be minimized.

Figure 17:
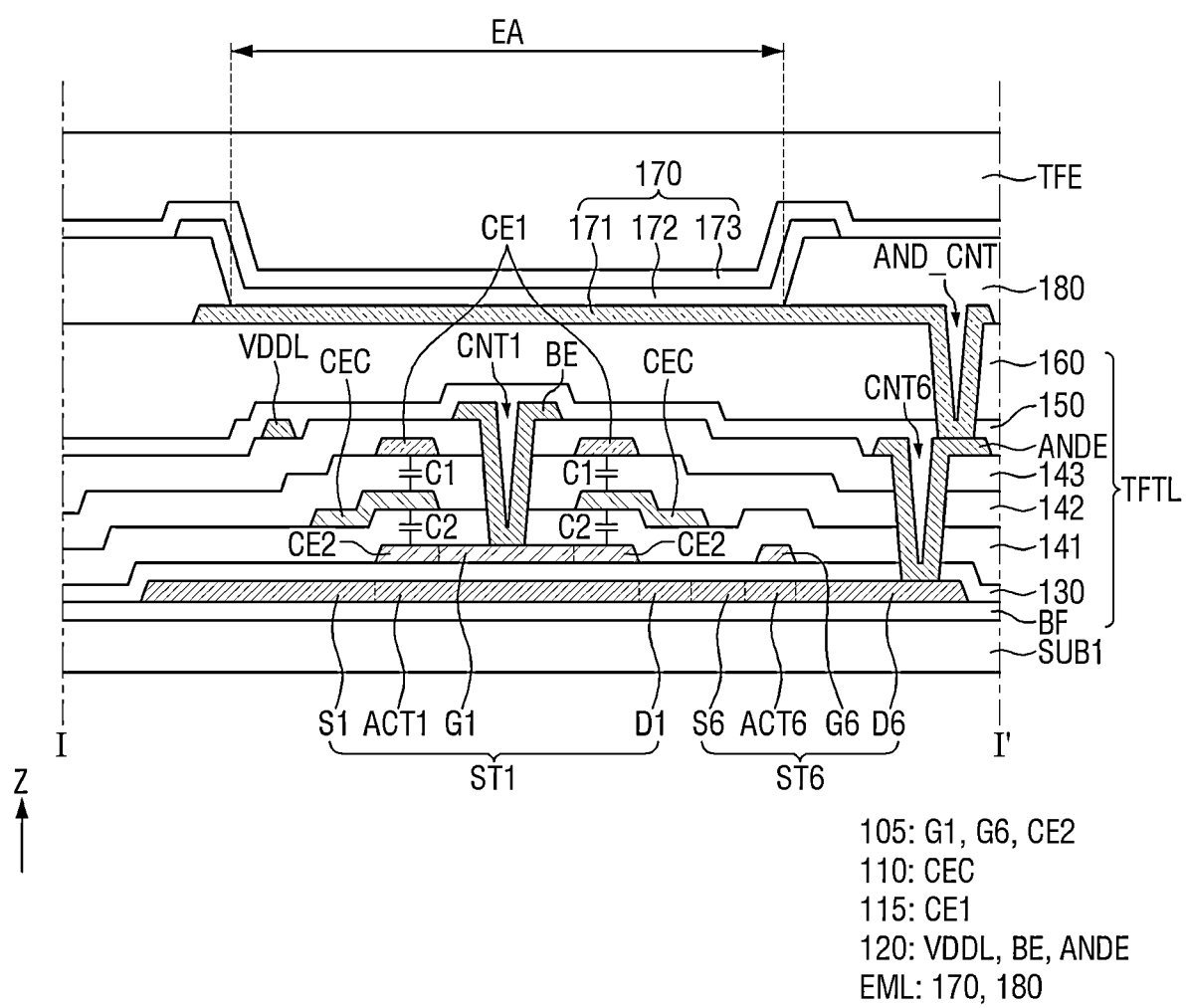
FIG. 17 is a schematic cross-sectional view illustrating an example taken along line I-I' of FIG. 12.
Figure 18:
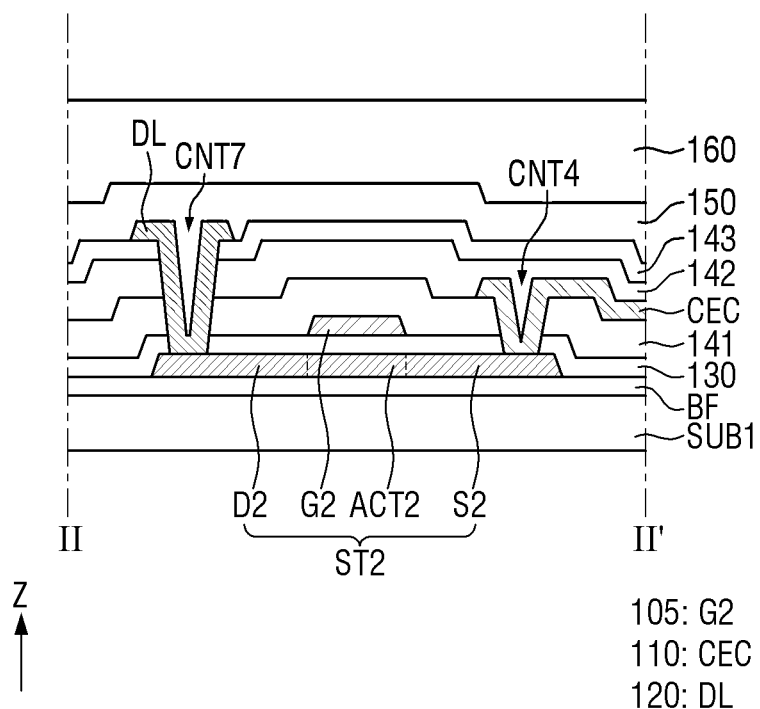
FIG. 18 is a schematic cross-sectional view illustrating an example taken along line II-II' of FIG. 12.

FIG. 17 is a schematic cross-sectional view illustrating an example taken along line I-I' of FIG. 12, and FIG. 18 is a schematic cross-sectional view illustrating an example taken along line II-II' of FIG. 12.

Referring to FIGS. 17 and 18, a thin film transistor layer TFTL, a light emitting element layer EML, and an encapsulation layer TFE may be sequentially formed on a substrate SUB1.

The thin film transistor layer TFTL includes a buffer layer BF, the active layer ACT, the first gate layer 105, the second gate layer 110, the third gate layer 115, the data metal layer 120, a gate insulating layer 130, a first interlayer insulating layer 141, a second interlayer insulating layer 142, a third interlayer insulating layer 143, a passivation layer 150, and a planarization layer 160.

The buffer layer BF may be formed on a surface of the substrate SUB1. The buffer layer BF may be formed on the substrate SUB1 to protect the thin film transistors and the organic light emitting layer 172 of the light emitting element layer EML from moisture permeating through the substrate SUB1 susceptible to moisture permeation. The buffer layer BF may include inorganic layers that are alternately stacked. For example, the buffer layer BF may include multiple layers in which one or more inorganic layers of a silicon nitride layer, a silicon oxynitride layer, a silicon oxide layer, a titanium oxide layer and an aluminum oxide layer are alternately stacked. In other examples, the buffer layer BF may be omitted.

The active layer ACT may be formed on the substrate SUB1 or the buffer layer BF. The active layer ACT may include polycrystalline silicon, monocrystalline silicon, low-temperature polycrystalline silicon, amorphous silicon, or an oxide semiconductor. A light blocking layer for blocking external light incident to the active layer ACT may be formed under the active layer ACT.

When the active layer ACT made of polycrystalline silicon is doped with ions, the active layer ACT doped with ions may have conductivity. Accordingly, the active layer ACT may include source electrodes S1 to S7 and drain electrodes D1 to D7 as well as active layers ACT1 to ACTT of the driving transistor ST1 and the second to seventh transistors ST2 to ST7.

The gate insulating layer 130 may be formed on the active layer ACT. The gate insulating layer 130 may include an inorganic layer, for example, a silicon nitride layer, a silicon oxynitride layer, a silicon oxide layer, a titanium oxide layer, or an aluminum oxide layer.

The first gate layer 105 may be formed on the gate insulating layer 130. The first gate layer 105 may include the scan lines GI, GC, GW, and GB, and the emission control lines EM as well as gate electrodes G1 to G7 of the driving transistor ST1 and the second to seventh transistors ST2 to ST7. The first gate layer 105 may be a single layer or multiple layers made of at least one of molybdenum (Mo), aluminum (Al), chromium (Cr), gold (Au), titanium (Ti), nickel (Ni), neodymium (Nd) and copper (Cu) or an alloy thereof.

The first interlayer insulating layer 141 may be formed on the first gate layer 105. The first interlayer insulating layer 141 may include an inorganic layer, for example, a silicon nitride layer, a silicon oxynitride layer, a silicon oxide layer, a titanium oxide layer, or an aluminum oxide layer. The first interlayer insulating layer 141 may include inorganic layers.

The second gate layer 110 may be formed on the first interlayer insulating layer 141. The second gate layer 110 may include the initialization voltage line VIL, the reference voltage line VEL, and the common capacitor electrode CEC. The second gate layer 110 may include a single layer or multiple layers made of at least one of molybdenum (Mo), aluminum (Al), chromium (Cr), gold (Au), titanium (Ti), nickel (Ni), neodymium (Nd) and copper (Cu) or an alloy thereof.

The second interlayer insulating layer 142 may be formed on the second gate layer 110. The second interlayer insulating layer 142 may include an inorganic layer, for example, a silicon nitride layer, a silicon oxynitride layer, a silicon oxide layer, a titanium oxide layer, or an aluminum oxide layer. The second interlayer insulating layer 142 may include multiple inorganic layers.

The third gate layer 115 may be formed on the second interlayer insulating layer 142. The third gate layer 115 may include the first capacitor electrode CE1. The third gate layer 115 may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof.

The third interlayer insulating layer 143 may be formed on the third gate layer 115. The third interlayer insulating layer 143 may include an inorganic layer, for example, a silicon nitride layer, a silicon oxynitride layer, a silicon oxide layer, a titanium oxide layer, or an aluminum oxide layer. The third interlayer insulating layer 143 may be made of inorganic films.

The data metal layer 120 may be formed on the third interlayer insulating layer 143. The data metal layer 120 may include the data lines DL, the first driving voltage lines VDDL, the connection electrode BE, and the anode connection electrode ANDE. The data metal layer 120 may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof.

The planarization layer 160 for flattening the stepped portion formed by the active layer ACT, the first gate layer 105, the second gate layer 110, the third gate layer 115, and the data metal layer 120 may be formed on the data metal layer 120. The planarization layer 160 may include an organic layer such as acryl resin, epoxy resin, phenolic resin, polyamide resin, polyimide resin and the like.

The passivation layer 150 may be further formed between the data metal layer 120 and the planarization layer 160. The passivation layer 150 may include an inorganic layer, for example, a silicon nitride layer, a silicon oxynitride layer, a silicon oxide layer, a titanium oxide layer, or an aluminum oxide layer.

Although it is illustrated that the driving transistor ST1 and the second to seventh transistors ST2 to ST7 are formed in a top gate structure in which the gate electrode is located above the active layer as shown in FIG. 17, it should be noted that the disclosure is not limited thereto. The driving transistor ST1 and the second to seventh transistors ST2 to ST7 may be formed in a bottom gate structure in which the gate electrode is located under the active layer or in a double gate structure in which the gate electrodes are located above and under the active layer.

The first contact hole CNT1 may be the hole exposing the gate electrode G1 of the driving transistor ST1 while penetrating the first interlayer insulating layer 141, the second interlayer insulating layer 142, and the third interlayer insulating layer 143 as shown in FIG. 17. The connection electrode BE may be electrically connected to the gate electrode G1 of the driving transistor ST1 through the first contact hole CNT1.

The second contact hole CNT2 (refer to FIG. 12) may be the hole exposing the second contact hole D3 of the third transistor ST3 while penetrating the gate insulating layer 130, the first interlayer insulating layer 141, the second interlayer insulating layer 142, and the third interlayer insulating layer 143. The connection electrode BE may be electrically connected to the second electrode D3 of the third transistor ST3 through the second contact hole CNT2.

The third contact hole CNT3 (refer to FIG. 12) may be the hole exposing the first capacitor electrode CE1 while penetrating the third interlayer insulating layer 143. The first driving voltage line VDDL may be electrically connected to the first capacitor electrode CE1 through the third contact hole CNT3.

The fourth contact hole CNT4 may be the hole exposing the first electrode S2 of the second transistor ST2 while penetrating the gate insulating layer 130 and the first interlayer insulating layer 141. The common capacitor electrode CEC may be electrically connected to the first electrode S2 of the second transistor ST2 through the fourth contact hole CNT4.

The fifth contact hole CNT5 (refer to FIG. 12) may be the hole exposing the first electrode S1 of the driving transistor ST1 while penetrating the gate insulating layer 130, the first interlayer insulating layer 141, the second interlayer insulating layer 142, and the third interlayer insulating layer 143. The first driving voltage line VDDL may be connected to the first electrode S1 of the driving transistor ST1 through the fifth contact hole CNT5.

The sixth contact hole CNT6 may be the hole exposing the second electrode D6 of the sixth transistor ST6 while penetrating the gate insulating layer 130, the first interlayer insulating layer 141, the second interlayer insulating layer 142, and the third interlayer insulating layer 143. The anode connection electrode ANDE may be connected to the second electrode D6 of the sixth transistor ST6 through the sixth contact hole CNT6.

The seventh contact hole CNT7 may be the hole exposing the second electrode D2 of the second transistor ST2 while penetrating the gate insulating layer 130, the first interlayer insulating layer 141, the second interlayer insulating layer 142, and the third interlayer insulating layer 143. The data line DL may be connected to the second electrode D2 of the second transistor ST2 through the seventh contact hole CNT7.

The anode contact hole AND_CNT may be the hole exposing the anode connection electrode ANDE while penetrating the passivation layer 150 and the planarization layer 160.

The light emitting element layer EML is formed on the thin film transistor layer TFTL. The light emitting element layer EML includes light emitting elements 170 and a pixel defining layer 180.

The light emitting elements 170 and the pixel defining layer 180 are formed on the planarization layer 160. Each of the light emitting elements 170 may include a first electrode 171, an organic light emitting layer 172, and a second electrode 173.

The first electrode 171 may be formed on the planarization layer 160. The first electrode 171 may be electrically connected to the anode connection electrode ANDE through the anode contact hole AND_CNT penetrating the passivation layer 150 and the planarization layer 160.

In a top emission structure in which light is emitted toward the second electrode 173 when viewed with respect to the organic light emitting layer 172, the first electrode 171 may include a metal material having high reflectivity such as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu).

The pixel defining layer 180 may be formed to partition the first electrode 171 on the planarization layer 160 to define an emission area EA of the sub-pixel SP. The pixel defining layer 180 may be formed to cover the edge of the first electrode 171. The pixel defining layer 180 may include an organic layer such as acryl resin, epoxy resin, phenolic resin, polyamide resin, polyimide resin and the like.

The emission area EA of the sub-pixel SP represents a region in which the first electrode 171, the organic light emitting layer 172, and the second electrode 173 are sequentially stacked and holes from the first electrode 171 and electrons from the second electrode 173 are coupled to each other in the organic light emitting layer 172 to emit light.

The organic light emitting layer 172 may be disposed on the first electrode 171 and the pixel defining layer 180. The organic light emitting layer 172 may include an organic material to emit light in a selected color. For example, the organic light emitting layer 172 may include a hole transporting layer, an organic material layer, and an electron transporting layer. The organic light emitting layer 172 of the sub-pixel SP may emit red, blue, or green light.

The second electrode 173 is formed on the organic light emitting layer 172. The second electrode 173 may be formed to cover the organic light emitting layer 172. The second electrode 173 may be a common layer commonly formed in the sub-pixel SP. A capping layer may be formed on the second electrode 173.

In the top emission structure, the second electrode 173 may include a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode 173 is made of a semi-transmissive metal material, the light emission efficiency can be increased due to a micro-cavity effect.

The encapsulation layer TFE may be formed on the light emitting element layer EML. The encapsulation layer TFE may include at least one inorganic layer to prevent oxygen or moisture from permeating into the light emitting element layer EML. The encapsulation layer TFE may include at least one organic layer to protect the light emitting element layer EML from foreign substances such as dust.

In other examples, instead of the encapsulation layer TFE, a second substrate may be disposed on the light emitting element layer EML, and the space between the light emitting element layer EML and the second substrate may be empty in a vacuum state, or a filling film may be disposed therein. The filling film may be an epoxy filling film or a silicon filling film.

Figure 19:
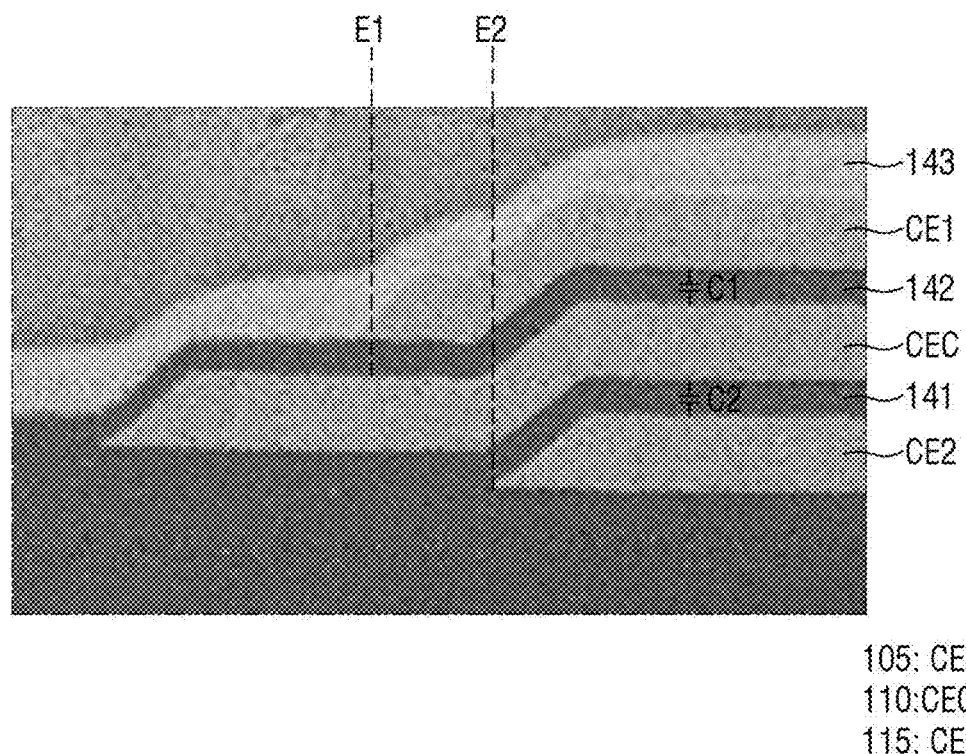
FIG. 19 is an enlarged cross-sectional view of parts of a first gate layer, a second gate layer, and a third gate layer according to an embodiment.

FIG. 19 is an enlarged schematic cross-sectional view of parts of a first gate layer, a second gate layer, and a third gate layer according to an embodiment.

In accordance with the embodiment, the second capacitor electrode CE2, the common capacitor electrode CEC, and the first capacitor electrode CE1 may be sequentially stacked in one sub-pixel SP. The capacitance of the first capacitor C1 and the capacitance of the second capacitor C2 may be the same. When the capacitance of the first capacitor C1 and the capacitance of the second capacitor C2 are not the same, the voltage variation ΔV of the first node N1 that is reflected in the second node N2 in each of the sub-pixels SP during the third period t3 is different from an intended one, so that the driving current Ids flowing through the driving transistor ST1 may be different from an intended one.

When the capacitance of the first capacitor C1 and the capacitance of the second capacitor C2 are the same, the overlapping area of the first capacitor electrode CE1 and the common capacitor electrode CEC and the overlapping area of the second capacitor electrode CE2 and the common capacitor electrode CEC may be substantially equal to each other. To this end, an edge E1 of the first capacitor electrode CE1 and an edge E2 of the second capacitor electrode CE2 may be designed to overlap in the third direction DR3.

However, as shown in FIG. 19, the side surface of the second capacitor electrode CE2 is inclined at a selected angle. Accordingly, in order to allow the edge E1 of the first capacitor electrode CE1 to overlap the edge E2 of the second capacitor electrode CE2 in the third direction DR3, the edge E1 of the first capacitor electrode CE1 should be disposed on the inclined top surface of the second interlayer insulating layer 142. However, misalignment may occur when the edge E1 of the first capacitor electrode CE1 is disposed on the inclined side surface of the second interlayer insulating layer 142 in the forming of the first capacitor electrode CE1 during the manufacturing process. The edge E1 of the first capacitor electrode CE1 and the edge E2 of the second capacitor electrode CE2 may not be aligned to each other in the third direction DR3.

Therefore, the overlapping area of the second capacitor electrode CE2 and the common capacitor electrode CEC may be different from the overlapping area of the first capacitor electrode CE1 and the common capacitor electrode CEC. For example, since the overlapping area of the first capacitor electrode CE1 and the common capacitor electrode CEC is greater than the overlapping area of the second capacitor electrode CE2 and the common capacitor electrode CEC, the capacitance of the first capacitor C1 and the capacitance of the second capacitor C2 may be different.

Hereinafter, the embodiments where the capacitance of the first capacitor C1 and the capacitance of the second capacitor C2 are substantially the same, or where the difference between the capacitance of the first capacitor C1 and the capacitance of the second capacitor C2 is minimized will be described in conjunction with FIGS. 20 to 22 and 23 to 25.

In an embodiment, in order to prevent the edge E1 of the first capacitor electrode CE1 from overlapping the inclined top surface of the second interlayer insulating layer 142 when overlapping the edge E2 of the second capacitor electrode CE2 in the third direction DR3, the arrangement positions and planar shapes of the first capacitor electrode CE1 and the common capacitor electrode CEC may be adjusted. The edge E1 of the first capacitor electrode CE1 may not be aligned with the edge E2 of the second capacitor electrode CE2. For example, as in FIG. 23, the first capacitor electrode CE1 may be shifted in the first direction (X-axis direction) and the second direction (Y-axis direction) with respect to the second capacitor electrode CE2.

Accordingly, the first capacitor electrode CE1 may be disposed to overlap a flat top surface P2 (refer to FIGS. 22 and 24) of the second capacitor electrode CE2 or the second interlayer insulating layer 142 without overlapping the inclined side surface S2 (refer to FIG. 22) of the second capacitor electrode CE2. Accordingly, the overlapping area of the first capacitor electrode CE1 and the common capacitor electrode CEC and the overlapping area of the second capacitor electrode CE2 and the common capacitor electrode CEC may be designed to be substantially equal to each other or the difference between the overlapping areas may be minimized.

In the display device 1 according to the embodiment, the capacitance difference between the first capacitor C1 and the second capacitor C2 may be minimized, and each capacitance may be maximized. Further, since the amount of current supplied to the light emitting element EL may be predicted, it is possible to ensure the reliability of the display device 1 and improve process yield.

In an embodiment, the side surface S2 (refer to FIG. 22) of the second capacitor electrode CE2 refers to a surface having a constant inclination angle with respect to the surface extending in the horizontal direction (X-axis direction or Y-axis direction). The top surface P2 (refer to FIGS. 22 and 24) of the second capacitor electrode CE2 is a flat surface without an inclination angle. The inclination angle of the top surface P2 (refer to FIGS. 22 and 24) is about 0°, but may include an angle close to about 0° depending on process errors.

Figure 20:
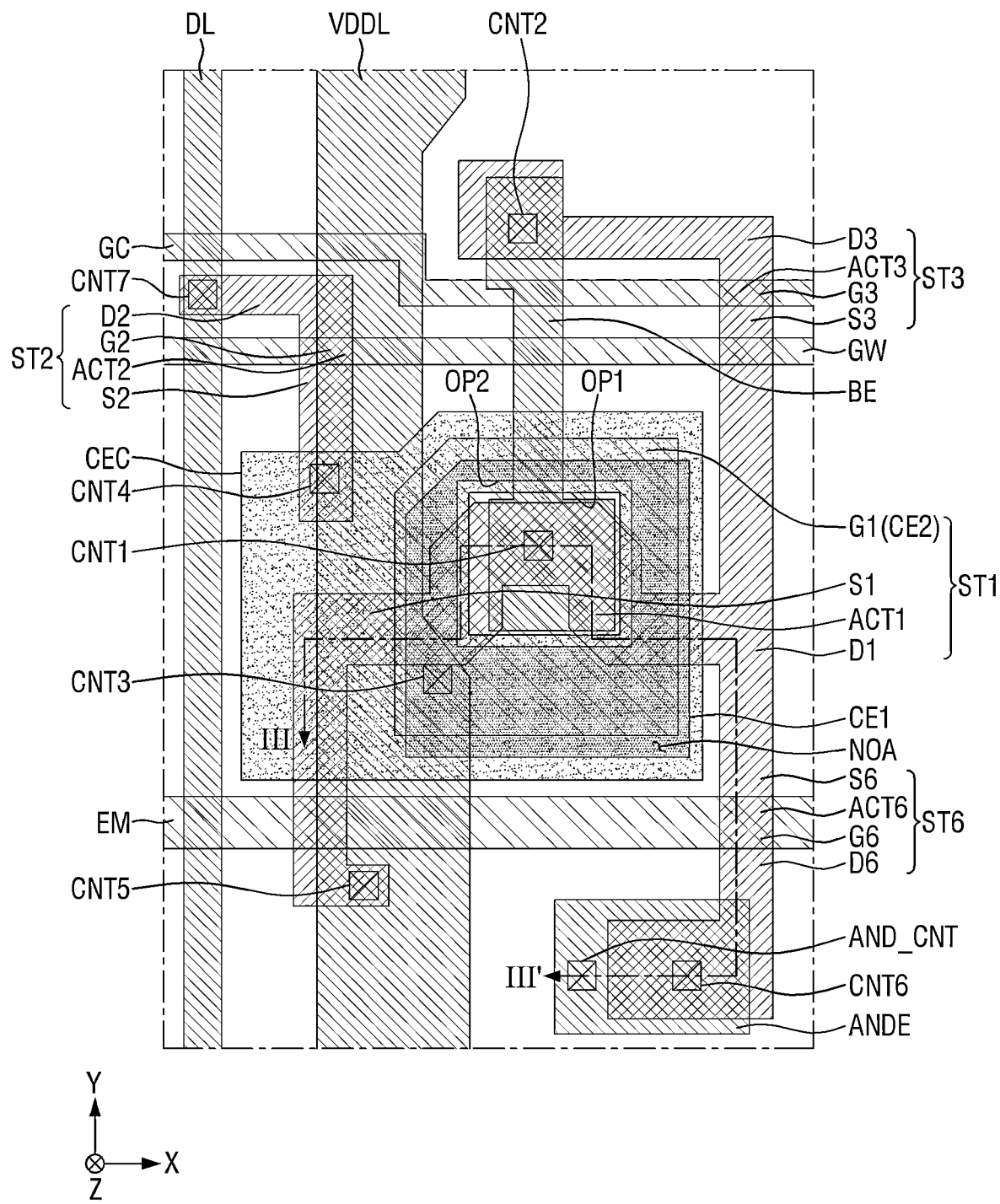
FIG. 20 is a schematic plan view showing a sub-pixel according to an embodiment.
Figure 21:
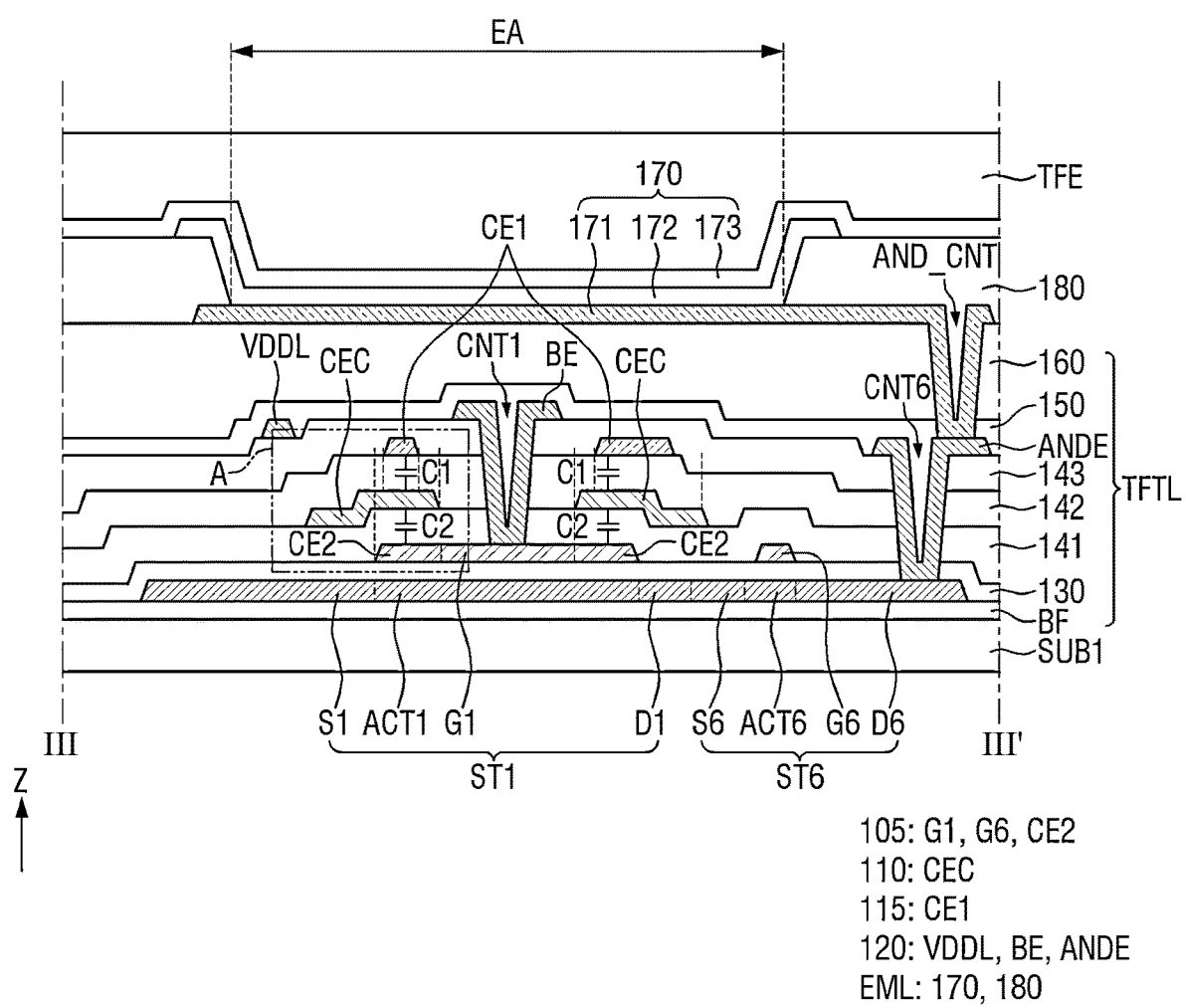
FIG. 21 is a schematic cross-sectional view illustrating an example taken along line III-III' of FIG. 20.
Figure 22:
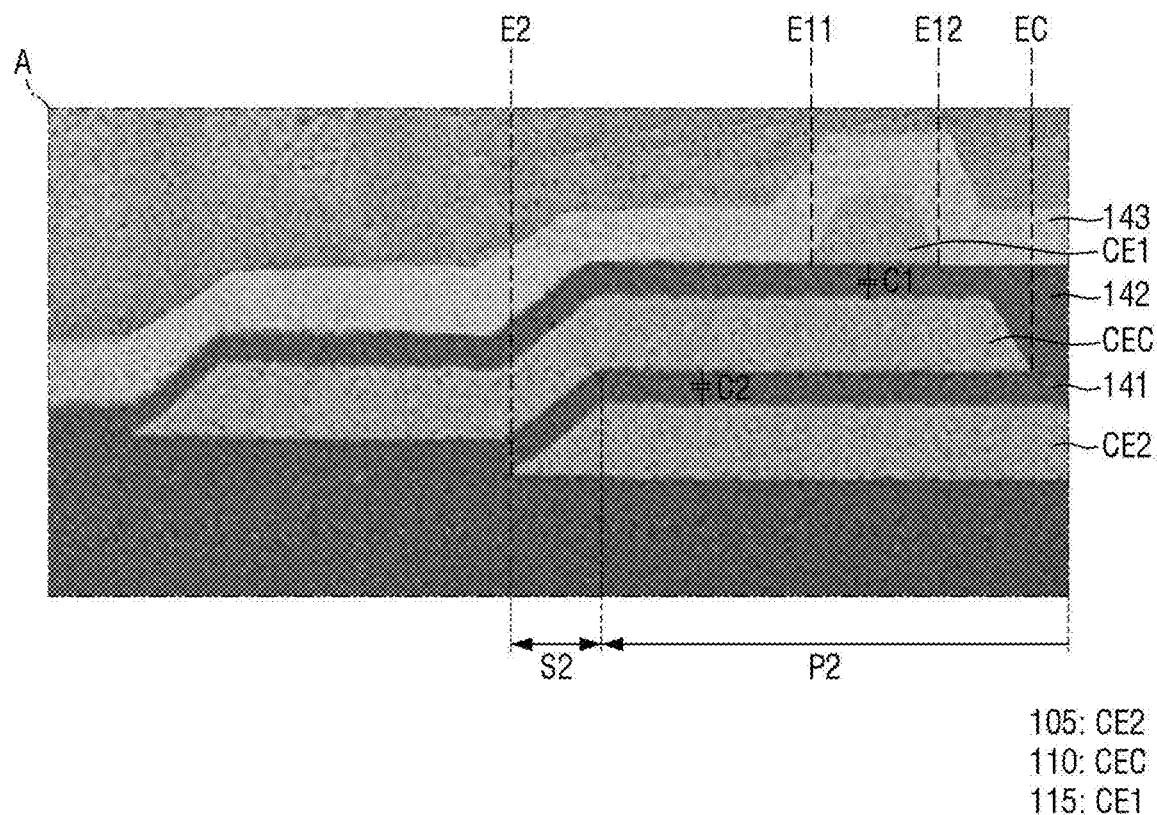
FIG. 22 is an enlarged view of the schematic cross-sectional view of area A of FIG. 21.

FIG. 20 is a schematic plan view showing a sub-pixel according to an embodiment, FIG. 21 is a schematic cross-sectional view illustrating an example taken along line III-III' of FIG. 20, and FIG. 22 is an enlarged schematic cross-sectional view of area A of FIG. 21.

Referring to FIGS. 20 to 22, the display device 1 according to the embodiment is different from the embodiment of FIGS. 12 to 18 in that the width of a first opening OP1 of the common capacitor electrode CEC disposed on the second gate layer 110 and the width of a second opening OP2 of the first capacitor electrode CE1 disposed on the third gate layer 115 are different, and the edge of the first capacitor electrode CE1 does not overlap the edge of the gate electrode G1 of the driving transistor ST1.

The common capacitor electrode CEC may include the first opening OP1 penetrating the common capacitor electrode CEC, and the first capacitor electrode CE1 may include the second opening OP2 penetrating the first capacitor electrode CE1. The first opening OP1 and the second opening OP2 may overlap in the third direction (Z-axis direction). The area of the second opening OP2 may be greater than the area of the first opening OP1. The width of the first opening OP1 in the first direction (X-axis direction) may be smaller than the width of the second opening OP2 in the first direction (X-axis direction), and the width of the first opening OP1 in the second direction (Y-axis direction) may be smaller than the width of the second opening OP2 in the second direction (Y-axis direction).

The first contact hole CNT1 electrically connecting the connection electrode BE to the gate electrode G1 of the driving transistor ST1 may be disposed in the first opening OP1 and the second opening OP2.

Accordingly, as shown in FIG. 22, the common capacitor electrode CEC may protrude more than the first capacitor electrode CE1 in the horizontal direction (X-axis direction or Y-axis direction). For example, an edge EC of the common capacitor electrode CEC may protrude more than an edge E12 of the first capacitor electrode CE1. The first capacitor electrode CE1 may be disposed on the flat top surface of the common capacitor electrode CEC. In accordance with the embodiment, the first capacitor electrode CE1 may be prevented from overlapping the side surface of the common capacitor electrode CEC, and thus may be prevented from being misaligned over the edge EC.

Even when the exposed area of the common capacitor electrode CEC (i.e., the area of the second opening OP2) is larger than the exposed area of the first capacitor electrode CE1 (i.e., the area of the first opening OP1), the area of the common capacitor electrode CEC may be larger than the areas of the first capacitor electrode CE1 and the second capacitor electrode CE2 as in an embodiment of FIG. 12.

The first capacitor electrode CE1 may be disposed to be shifted toward one side in the horizontal direction (X-axis direction or Y-axis direction) compared to the second capacitor electrode CE2. For example, the edge extending in the first direction (X-axis direction) of the first capacitor electrode CE1 may be disposed to be shifted toward one side in the second direction (Y-axis direction) compared to the edge extending in the first direction (X-axis direction) of the second capacitor electrode CE2. The edge extending in the second direction (Y-axis direction) of the first capacitor electrode CE1 may be disposed to be shifted toward one side in the first direction (X-axis direction) compared to the edge extending in the second direction (Y-axis direction) of the second capacitor electrode CE2. Although it is illustrated in the drawing that the first capacitor electrode CE1 is shifted to the right side in the first direction (X-axis direction) and the lower side in the second direction (Y-axis direction), in other examples the first capacitor electrode CE1 may be shifted in a different direction.

Since the first capacitor electrode CE1 and the second capacitor electrode CE2 do not completely overlap, the first capacitor electrode CE1 may include a non-overlapping area NOA that does not overlap the second capacitor electrode CE2. The non-overlapping area NOA may overlap the common capacitor electrode CEC.

Accordingly, the second capacitor electrode CE2 that is a part of the gate electrode G1 of the driving transistor ST1 may include a portion protruding more than the first capacitor electrode CE1 in the horizontal direction (X-axis direction or Y-axis direction). For example, the edge E2 of the second capacitor electrode CE2 may protrude more than an edge E11 of the first capacitor electrode CE1. The first capacitor electrode CE1 may overlap the flat top surface P2 of the second capacitor electrode CE2, and may not overlap the side surface S2 of the second capacitor electrode CE2. In accordance with the embodiment, the first capacitor electrode CE1 may be prevented from being misaligned over the edge E2 of the second capacitor electrode CE2.

In an embodiment, the area of the first capacitor electrode CE1 overlapping the common capacitor electrode CEC may be designed within a predicted range, so that it is possible to minimize the error of the capacitance of the capacitor due to the change in the area. Further, the capacitance of the first capacitor C1 and the capacitance of the second capacitor C2 may be designed to be substantially the same, and each capacitance may be maximized. Since the amount of current supplied to the light emitting element EL may be predicted in display device 1, the reliability of the display device 1 may be enhanced.

Figure 23:
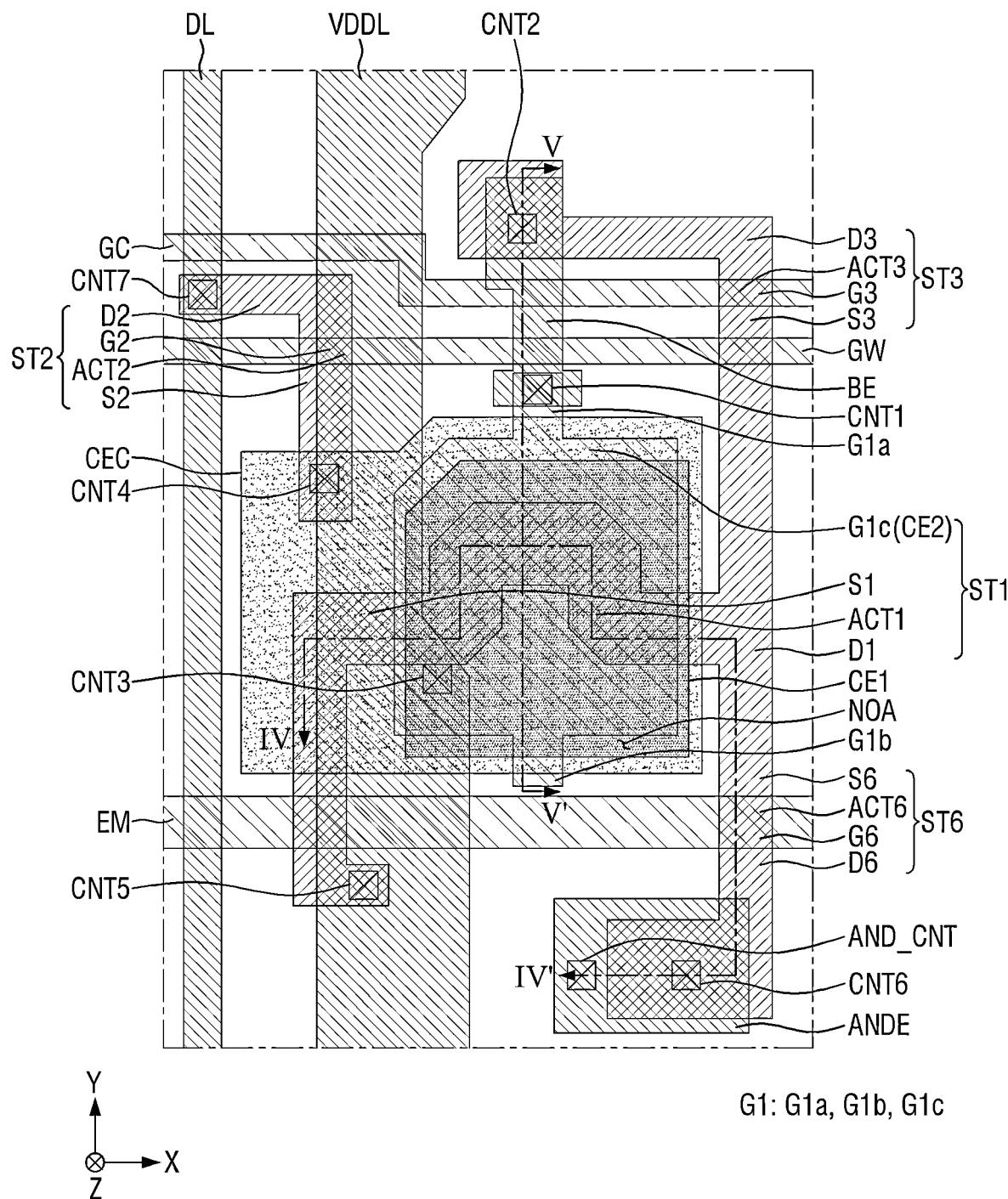
FIG. 23 is a schematic plan view illustrating a sub-pixel according to another embodiment.

Hereinafter, a display device 1 according to an embodiment will be described with reference to FIGS. 23 to 25. FIG. 23 is a schematic plan view illustrating a sub-pixel according to an embodiment, FIG. 24 is a schematic cross-sectional view illustrating an example taken along line IV-IV' of FIG. 23, and FIG. 25 is a cross-sectional view illustrating an example taken along line V-V of FIG. 23.

Figure 24:
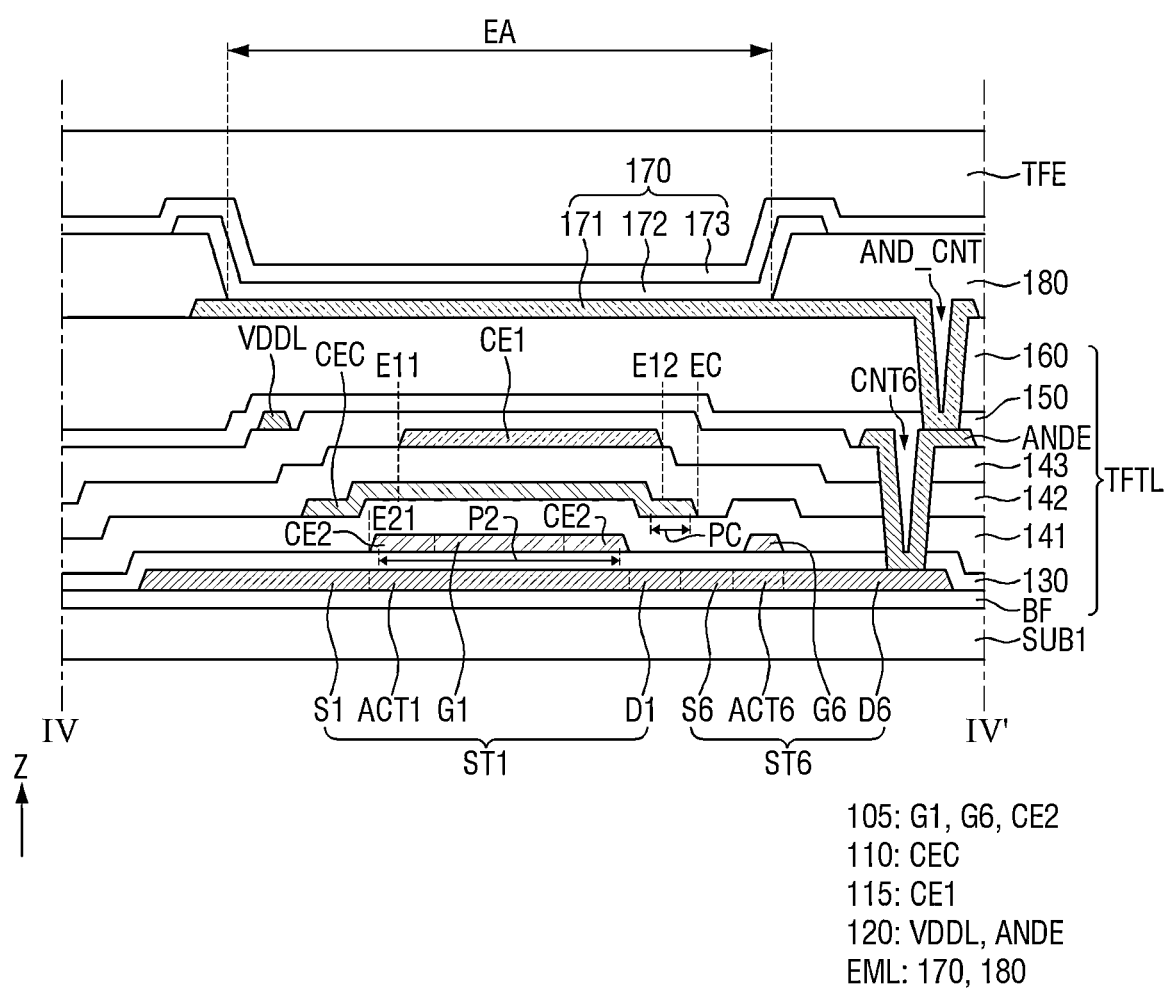
FIG. 24 is a schematic cross-sectional view illustrating an example taken along line IV-IV' of FIG. 23.
Figure 25:
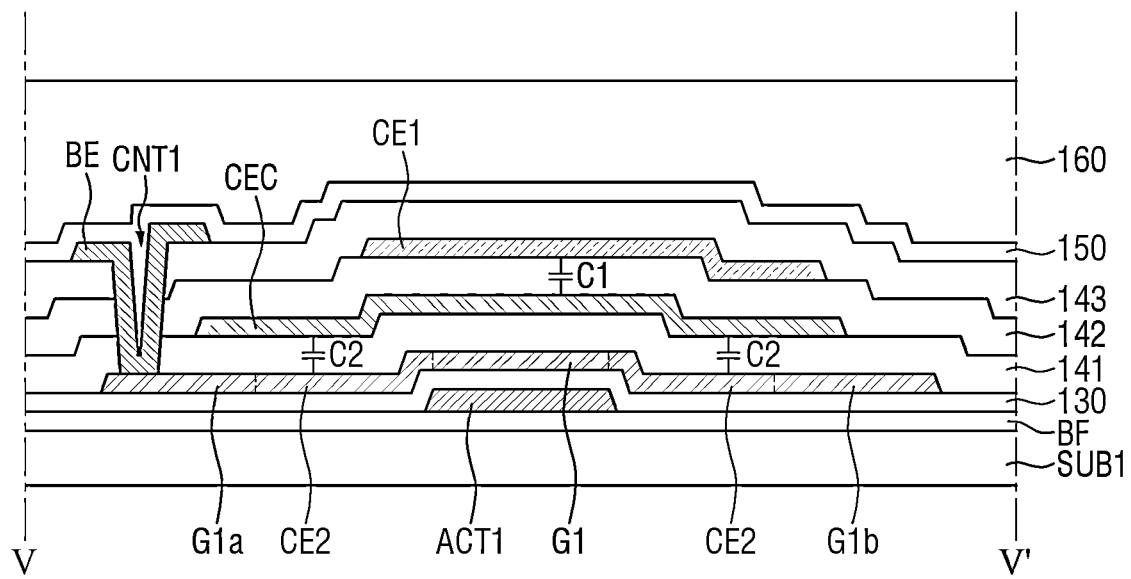
FIG. 25 is a schematic cross-sectional view illustrating an example taken along line V-V of FIG. 23.

Referring to FIGS. 23 to 25, the display device 1 according to the embodiment is different from the embodiment of FIGS. 20 to 22 in that the gate electrode G1 of the driving transistor ST1 includes a first protrusion G1a, a second protrusion G1b, and a main portion G1c, and the common capacitor electrode CEC and the first capacitor electrode CE1 do not include openings. They are the same in that the edge of the first capacitor electrode CE1 is disposed to avoid overlapping the edge of the gate electrode G1 of the driving transistor ST1 including the second capacitor electrode CE2.

The gate electrode G1 of the driving transistor ST1 may include the first protrusion G1a, the second protrusion G1b, and the main portion G1c. The gate electrode G1 of the driving transistor ST1 may be disposed between the third scan line GW and the emission control line EM.

The main portion G1c of the gate electrode G1 may include the region overlapping the active layer ACT in the third direction (Z-axis direction).

The first protrusion G1a and the second protrusion G1b of the gate electrode G1 may protrude in opposite directions with respect to the main portion G1c of the gate electrode G1. The first protrusion G1a and the second protrusion G1b may protrude in the second direction (Y-axis direction). The first protrusion G1a and the second protrusion G1b may be substantially symmetrical. Accordingly, it is possible to minimize errors that occur when the misalignment occurs in the second direction (Y-axis direction) as well as when the misalignment occurs in the first direction (X-axis direction).

In an embodiment, the first contact hole CNT1 may expose the first protrusion G1a of the gate electrode G1 of the driving transistor ST1. The first contact hole CNT1 may be located on a side (e.g., an upper side) of the gate electrode G1 in the second direction (Y-axis direction).

The connection electrode BE may be electrically connected to the first protrusion G1a of the gate electrode G1 through the first contact hole CNT1. The connection electrode BE may not overlap the main portion G1c of the gate electrode G1, the common capacitor electrode CEC, and the active layer ACT. The connection electrode BE may intersect the third scan line GW.

Since the first contact hole CNT1 does not expose the main portion G1c of the gate electrode G1, it may not include the opening exposing the common capacitor electrode CEC and the first capacitor electrode CE1. Accordingly, the overlapping area of the first capacitor electrode CE1 and the common capacitor electrode CEC and the overlapping area of the second capacitor electrode CE2 and the common capacitor electrode CEC may increase. This may increase the capacitances of the first capacitor C1 and the second capacitor C2.

The first protrusion G1a and the second protrusion G1b of the gate electrode G1 may include the portion that does not overlap the first capacitor electrode CE1 and the common capacitor electrode CEC.

Accordingly, as shown in FIG. 24, the common capacitor electrode CEC may protrude more than the first capacitor electrode CE1 in the horizontal direction (X-axis direction or Y-axis direction). For example, the edge EC of the common capacitor electrode CEC may protrude more than the edge E12 of the first capacitor electrode CE1. The first capacitor electrode CE1 may be disposed to overlap the flat top surface of the common capacitor electrode CEC in the third direction (Z-axis direction). In accordance with the embodiment, the first capacitor electrode CE1 avoids overlapping the side surface of the common capacitor electrode CE2, and thus may be prevented from being misaligned over the edge EC.

Further, the first capacitor electrode CE1 may be disposed to be shifted in the horizontal direction (X-axis direction or Y-axis direction) compared to the second capacitor electrode CE2. For example, the edge extending in the first direction (X-axis direction) of the first capacitor electrode CE1 may be shifted in the second direction (Y-axis direction) compared to the edge extending in the first direction (X-axis direction) of the second capacitor electrode CE2. The edge extending in the second direction (Y-axis direction) of the first capacitor electrode CE1 may be shifted in the first direction (X-axis direction) compared to the edge extending in the second direction (Y-axis direction) of the second capacitor electrode CE2. Although it is illustrated in the drawing that the first capacitor electrode CE1 is shifted to the right side in the first direction (X-axis direction) and shifted to the lower side in the second direction (Y-axis direction), the direction of the shifting may be modified.

In a cross-sectional view, the edge E11 of the first capacitor electrode CE1 may be disposed on the second interlayer insulating layer 142 corresponding to the top surface P2 of the second capacitor electrode CE2. Further, the edge E12 of the first capacitor electrode CE1 may be disposed on the second interlayer insulating layer 142 corresponding to a top surface PC of the common capacitor electrode CEC.

In an embodiment, the first capacitor electrode CE1 overlaps the flat top surface without overlapping the side surfaces of the common capacitor electrode CEC and the second capacitor electrode CE2, and thus may be prevented from being misaligned over the edge. Accordingly, it is possible to minimize the error of the capacitance of the capacitor due to the change in the areas of the capacitor electrodes.

The first capacitor C1 may be formed by the overlapping area of the first capacitor electrode CE1 and the common capacitor electrode CEC. The second capacitor C2 may be formed by the overlapping area of the second capacitor electrode CE2, the first protrusion G1a, the second protrusion G1b, and the common capacitor electrode CEC. Since the first capacitor electrode CE1 and the common capacitor electrode CEC are integrally formed without being exposed by the contact hole, the overlapping area may be maximized. The capacitances of the first capacitor C1 and the second capacitor C2 may be maximized. The capacitance of the first capacitor C1 and the capacitance of the second capacitor C2 may be substantially the same.

In the display device 1 according to the embodiment, the amount of current supplied to the light emitting element EL may be predicted, so that it is possible to ensure the reliability of the display device 1 and improve process yield.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising: a substrate;
a light emitting element disposed on the substrate;
a driving transistor providing a driving current to the light emitting element according to a voltage of a gate electrode;
a first transistor supplying a data voltage to the gate electrode of the driving transistor; a first capacitor comprising:
a first capacitor electrode electrically connected to a first driving voltage line to which a first driving voltage is applied; and
a common capacitor electrode electrically connected to a first electrode of the first transistor; and
a second capacitor comprising:
a second capacitor electrode electrically connected to the gate electrode of the driving transistor; and
the common capacitor electrode of the first capacitor, wherein
the first capacitor electrode, the common capacitor electrode, and the second capacitor electrode overlap each other in a thickness direction of the substrate,
the first capacitor and the second capacitor are electrically connected in series,
a size of an overlapping area of the first capacitor electrode and the common capacitor electrode and a size of an overlapping area of the second capacitor electrode and the common capacitor electrode are substantially equal to each other,
a reference voltage line applying a reference voltage to a first node; and
an initialization voltage line applying an initialization voltage to a second node wherein
the common capacitor electrode is electrically connected to the first node,
the second capacitor electrode is electrically connected to the second node, and
each of the initialization voltage line and the reference voltage line are held at a constant voltage.

2. The display device of claim 1, wherein the gate electrode of the driving transistor overlaps the common capacitor electrode in the thickness direction of the substrate.

3. The display device of claim 1, wherein
the first capacitor electrode comprises a non-overlapping area that does not overlap the second capacitor electrode in the thickness direction of the substrate, and
the non-overlapping area overlaps the common capacitor electrode in the thickness direction of the substrate.

4. The display device of claim 3, wherein
the first capacitor electrode comprises a first edge extending in a first direction and a second edge extending in a second direction,
the second capacitor electrode comprises a third edge extending in the first direction and a fourth edge extending in the second direction,
the first edge is shifted in the second direction compared to the third edge, and the second edge is shifted in the first direction compared to the fourth edge.

5. The display device of claim 3, wherein the first capacitor electrode is disposed on a flat top surface of the second capacitor electrode.

6. The display device of claim 5, wherein the first capacitor electrode does not overlap an inclined side surface of the second capacitor electrode in the thickness direction of the substrate.

7. The display device of claim 3, wherein
the common capacitor electrode comprises a first opening penetrating the common capacitor electrode,
the first capacitor electrode comprises a second opening penetrating the first capacitor electrode, and
the first opening and the second opening overlap each other in the thickness direction of the substrate.

8. The display device of claim 7, wherein an area of the second opening is greater than an area of the first opening.

9. The display device of claim 7, wherein
a width of the first opening in the first direction is smaller than a width of the second opening in the first direction, and
a width of the first opening in the second direction is smaller than a width of the second opening in the second direction.

10. The display device of claim 9, wherein an area of the common capacitor electrode is greater than each of an area of the first capacitor electrode and an area of the second capacitor electrode.

11. The display device of claim 10, further comprising:
a second contact hole that connects the common capacitor electrode to the first electrode of the first transistor.

12. The display device of claim 7, further comprising:
a connection electrode electrically connected to the gate electrode of the driving transistor through a first contact hole in the first opening and the second opening.

13. The display device of claim 3, wherein the gate electrode of the driving transistor comprises:
a main portion;
a first protrusion protruding in a direction from a side of the main portion; and
a second protrusion protruding in the direction from another side of the main portion.

14. The display device of claim 13, wherein the main portion overlaps, in the thickness direction of the substrate, an active layer comprising a semiconductor.

15. The display device of claim 14, further comprising:
a connection electrode electrically connected to the first protrusion through a first contact hole that exposes the first protrusion.

16. The display device of claim 15, wherein each of the first protrusion and the second protrusion comprises a portion that does not overlap the first capacitor electrode and the common capacitor electrode in the thickness direction of the substrate.

17. The display device of claim 13, wherein the gate electrode of the driving transistor is a single integrated monolithic unit comprised of a same material and formed from a same layer.

18. The display device of claim 1, wherein the first capacitor electrode and the second capacitor electrode are electrically different nodes.

19. The display device of claim 1, wherein a capacitance of the first capacitor and a capacitance of the second capacitor are substantially the same.

20. A display device comprising:
a an active layer disposed on a substrate;
a gate insulating layer disposed on the active layer;
a gate electrode and a first capacitor electrode disposed on the gate insulating layer, the gate electrode overlapping a part of the active layer in a thickness direction of the substrate;
a first interlayer insulating layer disposed on the gate electrode and the first capacitor electrode;
a common capacitor electrode disposed on the first interlayer insulating layer, the common capacitor electrode overlapping the first capacitor electrode in the thickness direction of the substrate;
a second interlayer insulating layer disposed on the common capacitor electrode; and
a second capacitor electrode disposed on the second interlayer insulating layer, the second capacitor electrode overlapping the common capacitor electrode in the thickness direction of the substrate, wherein
the first capacitor electrode, the common capacitor electrode, and the second capacitor electrode overlap each other in the thickness direction of the substrate,
the first capacitor electrode and the second capacitor electrode are electrically different nodes,
the first capacitor electrode, the common capacitor electrode, and the second capacitor electrode form two capacitors in series,
a size of an overlapping area of the first capacitor electrode and the common capacitor electrode and a size of an overlapping area of the second capacitor electrode and the common capacitor electrode are substantially equal to each other,
a reference voltage line applying a reference voltage to a first node; and
an initialization voltage line applying an initialization voltage to a second node, wherein the common capacitor electrode is electrically connected to the first node, the second capacitor electrode is electrically connected to the second node, and each of the initialization voltage line and the reference voltage line are held at a constant voltage.

* * * * *